(12) United States Patent
Kinoshita et al.

(10) Patent No.: US 8,764,935 B2
(45) Date of Patent: Jul. 1, 2014

(54) TAPE FEEDER AND A TAPE INSTALLING METHOD IN THE TAPE FEEDER

(75) Inventors: Yutaka Kinoshita, Yamanashi (JP); Kazuhide Nagao, Fukuoka (JP); Nobuhiro Nakai, Yamanashi (JP)

(73) Assignee: Panasonic Corporation, Osaka (JP)

( * ) Notice: Subject to any disclaimer, the term of this patent is extended or adjusted under 35 U.S.C. 154(b) by 166 days.

(21) Appl. No.: 13/579,374

(22) PCT Filed: Jan. 23, 2012

(86) PCT No.: PCT/JP2012/000396
§ 371 (c)(1),
(2), (4) Date: Aug. 16, 2012

(87) PCT Pub. No.: WO2012/102010
PCT Pub. Date: Aug. 2, 2012

(65) Prior Publication Data
US 2012/0305620 A1 Dec. 6, 2012

(30) Foreign Application Priority Data
Jan. 25, 2011 (JP) ................................. 2011-012605

(51) Int. Cl.
*B65H 5/28* (2006.01)
*B32B 38/10* (2006.01)

(52) U.S. Cl.
USPC ........... 156/714; 156/764; 156/930; 156/941; 221/25; 221/79; 221/87; 414/416.05

(58) Field of Classification Search
USPC ........ 156/714, 764, 930, 931; 221/25, 72, 73, 221/79, 87; 414/411, 412, 416.01, 416.03, 414/416.05, 416.08, 425, 811
See application file for complete search history.

(56) References Cited

U.S. PATENT DOCUMENTS

| | | | |
|---|---|---|---|
| 5,492,593 A * | 2/1996 | Ariga et al. | ................... 156/765 |
| 2002/0014002 A1 | 2/2002 | Bergstrom | |
| 2002/0053136 A1 | 5/2002 | Bergstrom | |
| 2004/0149383 A1 | 8/2004 | Bergstrom | |

(Continued)

FOREIGN PATENT DOCUMENTS

| JP | 2002-533944 A | 10/2002 |
|---|---|---|
| JP | 2008-277350 A | 11/2008 |
| JP | 4370058 A | 9/2009 |
| JP | 2010-212681 A | 9/2010 |

OTHER PUBLICATIONS

International Search Report for PCT/JP2012/000396 dated Mar. 13, 2012.

*Primary Examiner* — Mark A Osele
(74) *Attorney, Agent, or Firm* — Pearne & Gordon LLP

(57) ABSTRACT

In a structure that exfoliation is performed in the pitch sending of a carrier tape (15) by making a cover tape exfoliating mechanism (50) intervene between joining surfaces of a base tape (15*a*) and a cover tape (15*e*), in an exfoliation start position where an exfoliating knife tip (51*f*) of an acuminate shape, which is provided at a front end, starts to exfoliate the joining surface, a lower guide member (40), which guides the carrier tape (15) from below, is pushed up from the bottom side by a lever member (44), and when the carrier tape (15) is installed, the carrier tape (15) is pushed up together with the lower guide member (40) to make the exfoliating knife tip (51*f*) in the exfoliation start position to be aligned to the joining surfaces and enter between the joining surfaces.

6 Claims, 18 Drawing Sheets

(56) References Cited

U.S. PATENT DOCUMENTS

2005/0006030 A1 1/2005 Bergstrom
2010/0239401 A1 9/2010 Kim
2011/0243695 A1* 10/2011 Hwang et al. ................. 414/412

* cited by examiner

FIG. 17
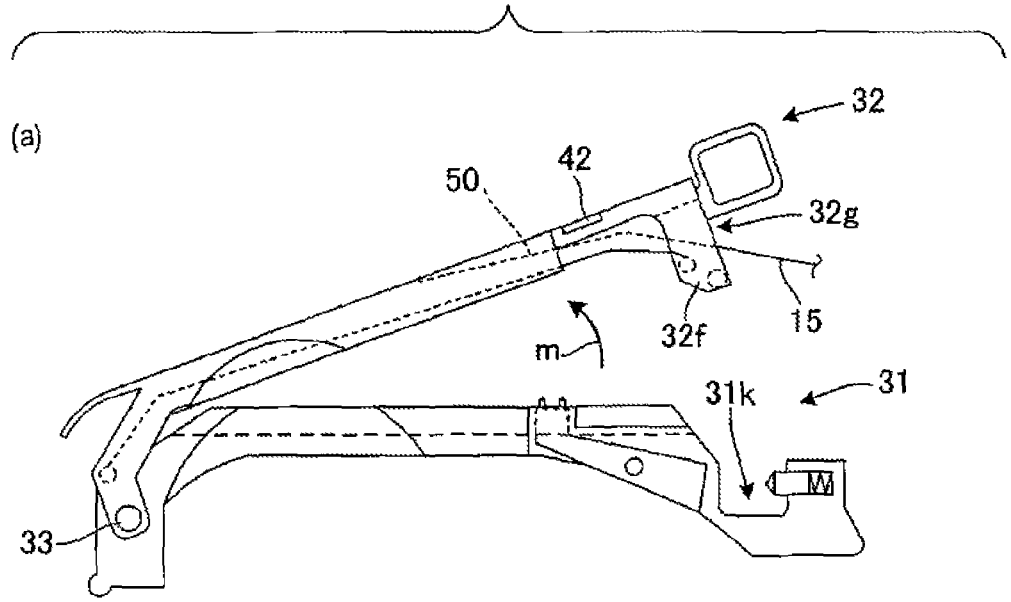
(a)
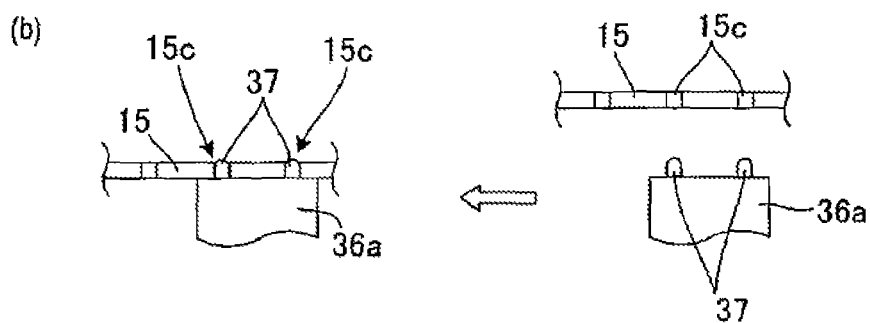
(b)
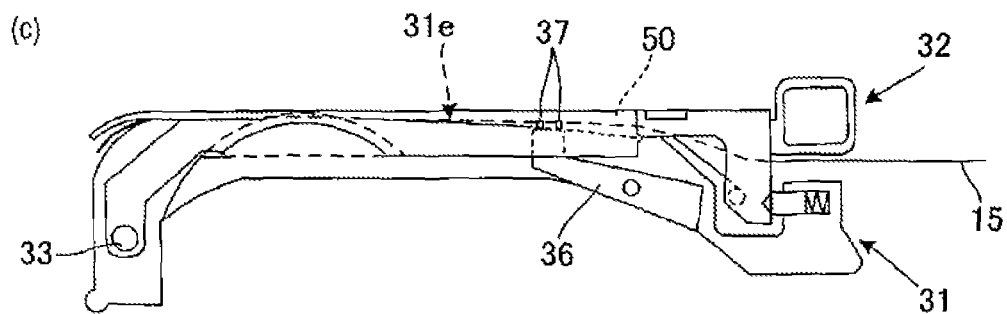
(c)

TAPE FEEDER AND A TAPE INSTALLING METHOD IN THE TAPE FEEDER

TECHNICAL FIELD

The invention relates to a tape feeder which supplies electronic components which are to be mounted in a component mounting device and are held by a carrier tape to a pickup position of a component loading mechanism, and a tape installing method in the tape feeder which installs the carrier tape to the tape feeder.

BACKGROUND ART

A tape feeder is known as a supply device of electronic components in a component mounting device. By intermittently sending a carrier tape which holds electronic components, the tape feeder supplies the electronic components to a pickup position of a transferring head of a component loading mechanism. The carrier tape is pitch sent by a tape sending mechanism along a tape path provided in the body part of the tape feeder near the pickup position while the upper part of the carrier tape is covered by a cover tape and the carrier tape is guided. Thus, the electronic components are picked up by the transferring head of the component loading mechanism through a component takeout opening that a cover member is provided with at the pickup position.

The carrier tape which holds electronic components is generally supplied by being wound around a supply reel, and when a new carrier tape is installed, a tape installing operation is performed which inserts the carrier tape which is drawn out from the supply reel from a tape takeout part, and sets at the bottom side of the cover member in the pickup position. In this tape installing operation, complicated operations are required, that is, after the sending holes of the carrier tape are properly engaged with the sending pin of a sprocket which forms the tape sending mechanism, the carrier tape is pressed from above to the tape path by a pressing member to be set in the body part.

Therefore, in order to make the tape installing operation easy, a tape feeder is known conventionally in which a tape guide which guides the carrier tape near the pickup position is attachable and detachable to/from the body part, and which includes an exfoliating member in the tape guide which exfoliates the cover tape from the carrier tape (for example, refer to a patent document 1). According to this structure, the carrier tape can be set to the tape guide when the tape guide is detached from the body part, and there is an advantage that the operativity of the tape installing operation can be improved.

RELATED ART DOCUMENTS

Patent Documents

Patent document 1: Japan Patent Publication No. 4370058

SUMMARY OF THE INVENTION

Problem to be Solved by the Invention

However, in the related art including the above-described patent document in which the carrier tape is set when the tape guide is detached from the body part and the exfoliating member which exfoliates the cover tape from the carrier tape is included in the tape guide, there are the following drawbacks when the carrier tape is installed to the tape feeder. That is, as described earlier, when the carrier tape is installed, it is necessary to precisely align the exfoliating member for exfoliating the cover tape to the joining surfaces of the carrier tape and the cover tape, but this alignment needs a careful finger operation of an operator. Thus, there are problems that it needs time to confirm the alignment when the carrier tape is installed to the tape guide, and efforts and time are needed in the carrier tape installing operation.

Thus, the present invention is intended to provide a tape feeder and a tape installing method in the tape feeder which makes it possible to improve the operativity and operation efficiency by making the alignment in the carrier tape installing operation easy.

Means for Solving the Problems

A tape feeder of this invention, which sequentially supplies electronic components to a pickup position of a transferring head by pitch sending a carrier tape which holds the electronic components in component accommodating recesses, comprising a body part which is provided with a tape path which leads the carrier tape which comprises a base tape in which the recesses are formed and a top tape which is attached onto the top surface of the base tape by covering the recesses, a tape sending mechanism which is provided in the body part and pitch sends the carrier tape at a predetermined pitch by making a sprocket to be intermittently rotated when sending pins of the sprocket are engaged with sending holes which are provided in the base tape, and a guide part which guides the carrier tape which is sent by the tape sending mechanism in a predetermined range including the pickup position on the body part and is formed to be attachable and detachable to and from the body part, wherein the guide part comprises a bottom member which guides the bottom side of the carrier tape, and is provided with an attaching and detaching mechanism for attaching and detaching to and from the body part, a top member which guides the carrier tape in a widthwise direction and guides the top surface of the carrier tape by pressing the carrier tape down from above with a guide surface, an opening and closing mechanism which opens and closes the top member relative to the bottom member, a lower guide member which is provided in the top member and guides the carrier tape from below when the carrier tape is installed to the top member after the top member is opened from the bottom member by the opening and closing mechanism, an exfoliating member which is provided at the guide surface of the top member and makes a joining surface to be exfoliated in an exfoliation object range at least including the recesses by intervening between the joining surfaces of the base tape and the top tape in the pitch sending of the carrier tape, and a pushing up unit which pushes up the lower guide member from the bottom side in an exfoliation start position where an exfoliating knife tip of an acuminate shape which is provided at the upstream end of the exfoliating member in the pitch sending direction starts to exfoliate the joining surface, and wherein when the carrier tape is installed to the top member, the carrier tape to be installed is pushed up together with the lower guide member by the pushing up unit to make the exfoliating knife tip in the exfoliation start position to be aligned to the joining surfaces and enter between the joining surfaces.

A tape installing method of this invention in a tape feeder which sequentially supplies electronic components to a pickup position of a transferring head by pitch sending a carrier tape which holds the electronic components in component accommodating recesses, and comprises a body part which is provided with a tape path which leads the carrier tape which comprises a base tape in which the component accommodating recesses are formed and a top tape which is attached onto the top surface of the base tape by covering the recesses, a tape sending mechanism which is provided in the body part and pitch sends the carrier tape at a predetermined pitch by making a sprocket to be intermittently rotated when sending pins of the sprocket are engaged with sending holes which are provided in the base tape, and a guide part which guides the carrier tape which is sent by the tape sending mechanism in a predetermined range including the pickup position on the body part and is formed to be attachable and detachable to and from the body part, wherein the guide part comprises a bottom member which guides the bottom side of the carrier tape, and is provided with an attaching and detaching mechanism for attaching and detaching to and from the body part, a top member which guides the carrier tape in a widthwise direction and guides the top surface of the carrier tape by pressing the carrier tape down from above with a guide surface, an opening and closing mechanism which opens and closes the top member relative to the bottom member, a lower guide member which is provided in the top member and guides the carrier tape from below when the carrier tape is installed to the top member after the top member is opened from the bottom member by the opening and closing mechanism, and an exfoliating member which is provided at the guide surface of the top member and makes a joining surface to be exfoliated in an exfoliation object range at least including the recesses by intervening between the joining surfaces of the base tape and the top tape in the pitch sending of the carrier tape, and wherein the tape installing method installs the carrier tape to the tape feeder and in a tape introducing step of introducing the carrier tape into the guide part after the guide part is detached from the body part, when the carrier tape is installed to the top member, in an exfoliation start position where an exfoliating knife tip of an acuminate shape which is provided at the upstream end of the exfoliating member in the pitch sending direction starts to exfoliate the joining surface, the carrier tape to be installed is pushed up together with the lower guide member to make the exfoliating knife tip in the exfoliation start position to be aligned to the joining surfaces and enter between the joining surfaces.

Effect of the Invention

According to the present invention, in the structure that the joining surface is exfoliated in the pitch sending of the carrier tape by making the exfoliating member intervene between the joining surfaces of the base tape and the top tape, in the exfoliation start position where the exfoliating knife tip of an acuminate shape which is provided at the upstream end of the exfoliating member starts to exfoliate the joining surface, the pushing up unit is included that pushes up the lower guide member, which guides the carrier tape from below, from the bottom side, and when the carrier tape is installed, the carrier tape is pushed up together with the lower guide member by the pushing up unit to make the exfoliating knife tip in the exfoliation start position to be aligned to the joining surfaces and enter between the joining surfaces. Thereby, the alignment in the carrier tape installing operation is facilitated, and the operativity and operation efficiency can be improved.

BRIEF DESCRIPTION OF THE FIGURES

FIGS. 17(*a*) to 17(*c*) are illustrative figures of steps of a tape installing method in the tape feeder of the embodiment of the invention.

EMBODIMENTS OF THE INVENTION

Next, an embodiment of the invention is described with reference to the figures. First, the structure of a component mounting device 1 which mounts electronic components on boards is described with reference to FIGS. 1 and 2. The component mounting device 1 has a function of mounting electronic components such as semiconductor chips on boards, and FIG. 2 partially shows an AA section in FIG. 1.

Figure 1:
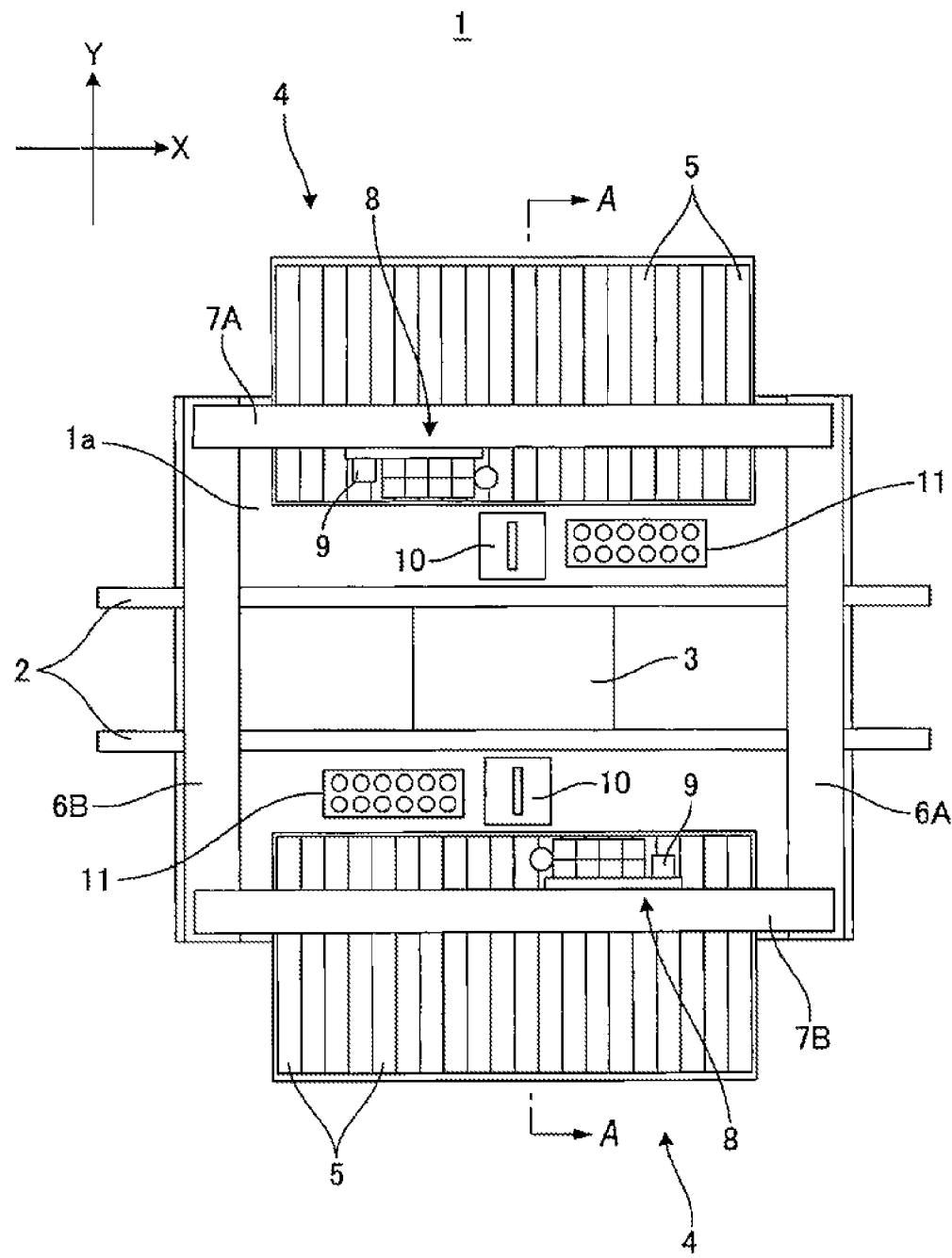
FIG. 1 is a top view of a component mounting device of one embodiment of the present invention.

In FIG. 1, a board conveying mechanism 2 is disposed at the center of a base 1*a* in the X direction (board conveying direction). The board conveying mechanism 2 conveys a board 3 which is imported from upstream, and positions the board 3 at a mounting stage which is set to perform component mounting operations. A component supply part 4 is arranged at each of the two sides of the board conveying mechanism 2, and a plurality of tape feeders 5 are provided in parallel in each of the component supply parts 4. The tape feeder 5 supplies electronic components to a pickup position of an adsorbing nozzle of a transferring head described below by pitch sending a carrier tape which holds the electronic components.

Y axis tables 6A and 6B are disposed at two ends of the top surface of the base 1a, and two X axis tables 7A and 7B are built on the Y axis tables 6A and 6B. By driving the Y axis table 6A, the X axis table 7A is moved in the Y direction horizontally, and by driving the Y axis table 6B, the X axis table 7B is moved in the Y direction horizontally. Board recognition cameras 9 which are moved integrally with transferring heads 8, respectively, are installed to the X axis tables 7A and 7B.

By combining and driving the Y axis table 6A, the X axis table 7A, the Y axis table 6B and the X axis table 7B, respectively, the transferring heads 8 are moved horizontally, pick up electronic components from the component supply parts 4 with adsorbing nozzles 8a (refer to FIG. 2), and mount on the board 3 which is positioned by the board conveying mechanism 2. The Y axis table 6A, the X axis table 7A, the Y axis table 6B and the X axis table 7B become a head moving mechanism that moves the transferring heads 8.

The board recognition cameras 9 which are moved over the board 3 together with the transferring heads 8 image and recognize the board 3. Further, component recognition cameras 10 are disposed on paths from the component supply parts 4 to the board conveying mechanism 2. When a transferring head 8 which took out an electronic components from the component supply part 4 is moved to the board 3 which is positioned by the mounting stage, the component recognition camera 10 images the electronic component held by the adsorbing nozzle 8a when the electronic component held by the adsorbing nozzle 8a is moved over the component recognition camera 10 in the X direction. When the above imaging result is recognized by a recognition device (not shown in the figures), the position of the electronic component held by the adsorbing nozzle 8a is recognized, and the type of the electronic component is identified. Nozzle holding parts 11 accommodate a plurality of types of adsorbing nozzles 8a with a predetermined posture, and a nozzle exchange is performed in accordance with the type of electronic components to be mounted in the transferring head 8 when the transferring head 8 accesses the nozzle holding parts 11 and performs an exchange action.

Figure 2:
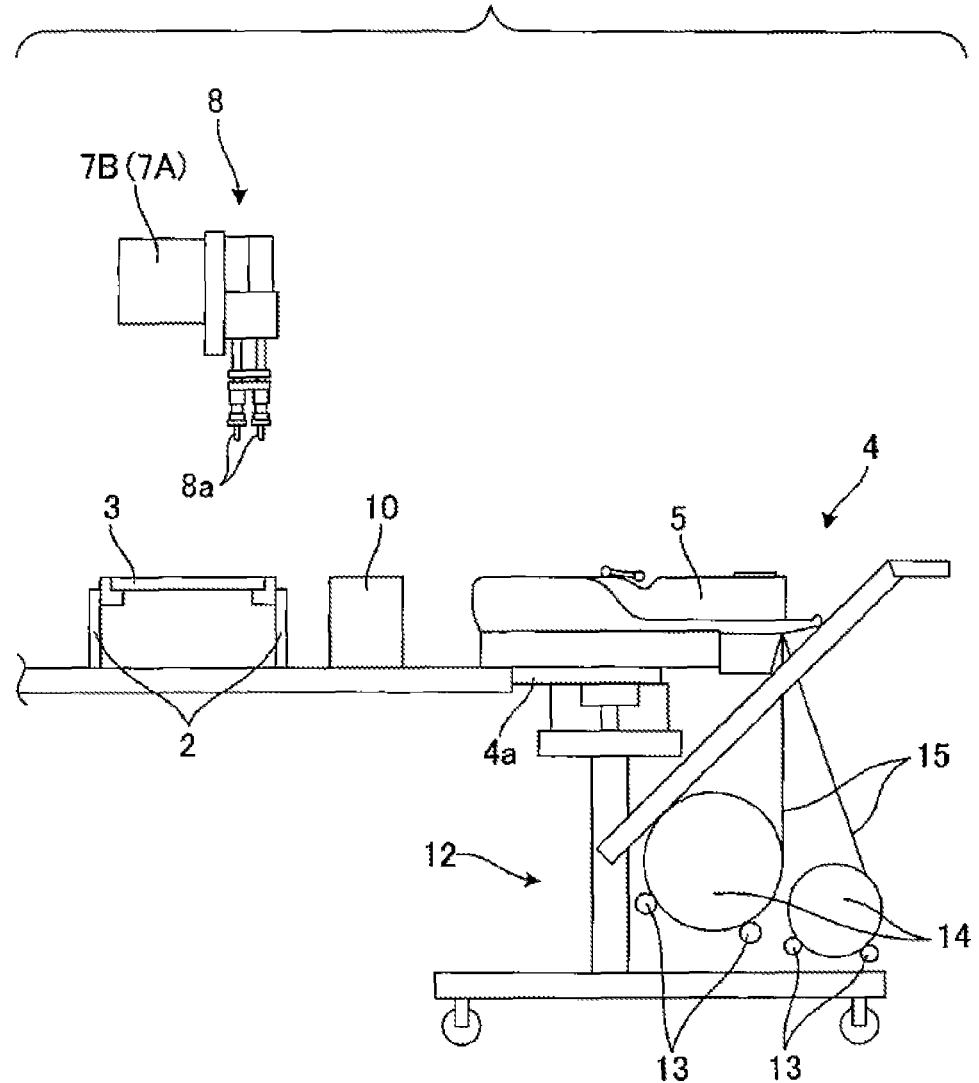
FIG. 2 is a partial sectional view of the component mounting device of the embodiment of the invention.

A structure of the component supply part 4 is described. As shown in FIG. 2, a feeder base 4a is provided in the component supply part 4 to install the plurality of tape feeders 5. The tape feeders 5 are arranged in the component supply part 4 by a feeder installing carriage 12, and the carriage 12 is provided with reel holding parts 13 for holding tape reels 14 which accommodate carrier tapes 15 in a wound state. The reel holding parts 13 include holding rollers for rotatably holding the tape reels 14, and by rotating the tape reels 14 which are arranged in the component supply part 4, the carrier tapes 15 can be drawn out.

Figure 3:
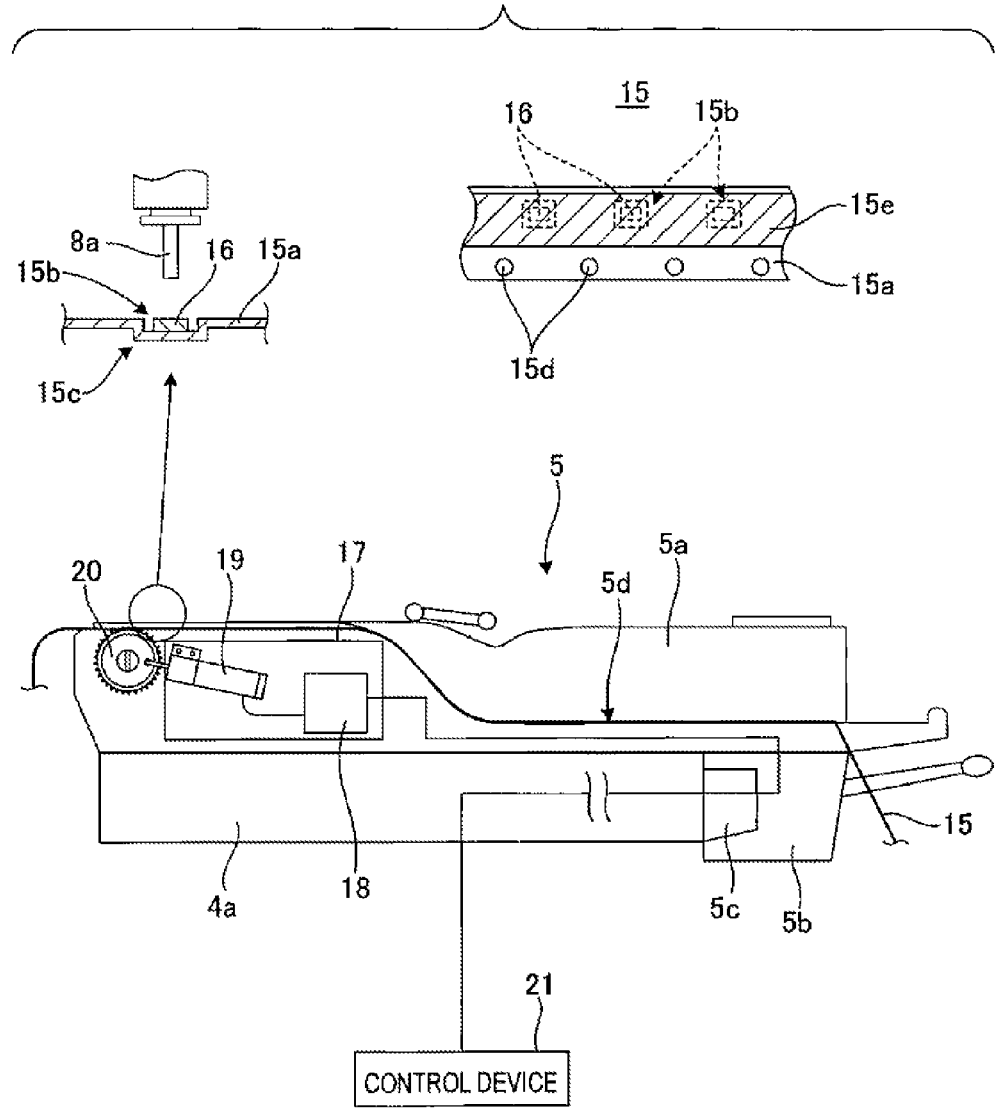
FIG. 3 is an illustrative figure of the structure of a tape feeder of the embodiment of the invention.

Next, a structure and functions of the tape feeder 5 are described with reference to FIG. 3. As shown in FIG. 3, the tape feeder 5 includes a body part 5a and an installing part 5b which is protruded downwards from the bottom surface of the body part 5a. When the tape feeder 5 is installed by making the bottom surface of the body part 5a go along the feeder base 4a, a connector 5c which is provided in the installing part 5b is fitted with the feeder base 4a. Thereby, while the tape feeder 5 is fixed and installed to the component supply part 4, and the tape feeder 5 is electrically connected to a control device 21 of the component mounting device 1.

A tape path 5d, which leads the carrier tape 15 which is drawn out from the tape reel 14 and taken into the body part 5a, is continuously provided inside the body part 5a from the back end of the body part 5a to the front end of the body part 5a. The carrier tape 15 has such a structure that in a base tape 15a which forms the tape body, component pockets 15b which are component accommodating recesses for accommodating and holding electronic components 16 and sending holes 15d for pitch sending the carrier tape 15 are provided at a predetermined pitch. An embossed part 15c which is convexed downwards from the base tape 15a is formed at the bottom side of the component pocket 15b. A cover tape 15e is attached onto the top surface of the base tape 15a by covering the component pockets 15b, to prevent the electronic components 16 from falling out from the component pockets 15b.

A tape sending part 17 for pitch sending the carrier tape 15 is built in the body part 5a. The tape sending part 17 includes a sending motor 19 which rotationally drives a sprocket 20 which is provided at the front end of the tape path 5d, and a feeder control part 18 which controls the sending motor 19. When the tape feeder 5 is installed to the feeder base 4a, the feeder control part 18 is connected to the control device 21.

Sending pins 20a (refer to FIG. 8) that are fitted with the sending holes 15d are provided at a predetermined pitch on the sprocket 20. When these sending pins are engaged with the sending holes 15d, by driving the sending motor 19 to make the sprocket 20 to be intermittently rotated through a bevel gear 25 which is couple to a rotation axis 19a, the carrier tape 15 is pitch sent to the downstream side (left side in FIG. 3). The sprocket 20 and the sending motor 19 form a tape sending mechanism which pitch sends the carrier tape 15 at a predetermined pitch by making the sprocket 20 to be intermittently rotated when the sending pins 20a of the sprocket 20 which is provided at the body part 5a are engaged with the sending holes 15d.

The front side of the sprocket 20 becomes a pickup position where the electronic component 16 in the component pocket 15b is adsorbed and taken out by the adsorbing nozzle 8a of the transferring head 8. The carrier tape 15, which is sent along the tape path 5d by the above-mentioned tape sending mechanism, is guided by a guide part 30 described below in a predetermined range including the above pickup position, namely, a range that is required to lead the carrier tape 15 to the pickup position of the adsorbing nozzle 8a, and to make the sending holes 15d to be properly engaged with the sending pins 20a. For the cover tape 15e which is attached onto the base tape 15a, the joining surface with the base tape 15a is partially exfoliated by a tape exfoliating mechanism which is incorporated in the guide part 30 so that the electronic component 16 in the component pocket 15b is exposed.

Figure 4:
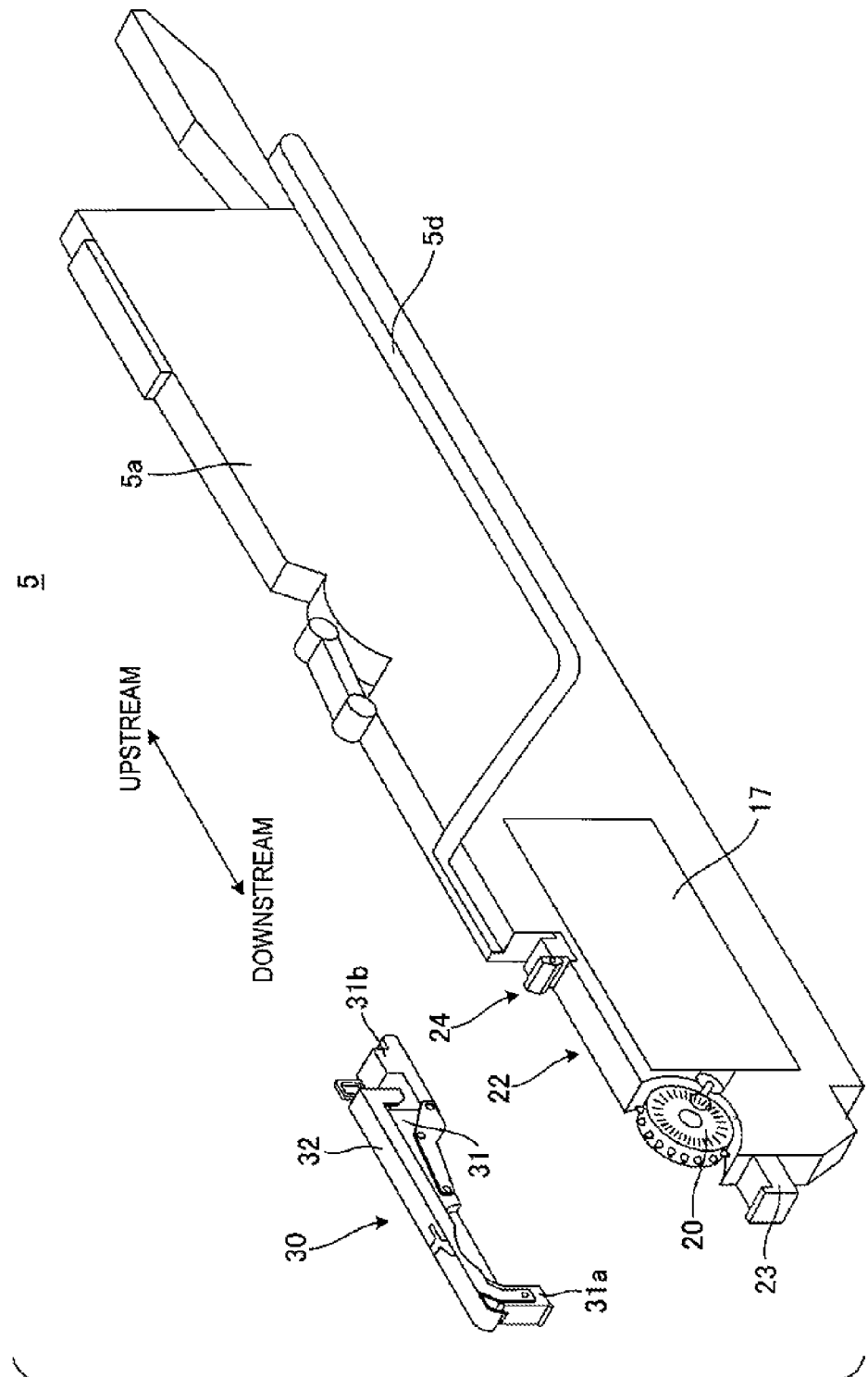
FIG. 4 is a perspective view of the tape feeder of the embodiment of the invention.

As shown in FIG. 4, a predetermined range of the front end in the body part 5a (downstream side in the tape sending direction) becomes a guide installing part 22 which the guide part 30 is attached to and detached from. The guide part 30 includes a bottom member 31 and a top member 32. By engaging and fixing a downstream installing part 31a and an upstream installing part 31b, which the bottom member 31 is provided with, with and to a downstream fitting part 23 and an upstream locking part 24, respectively, the guide part 30 is installed to the guide installing part 22, and by performing the above operations inversely, the guide part 30 is detached from the guide installing part 22.

Figure 5:
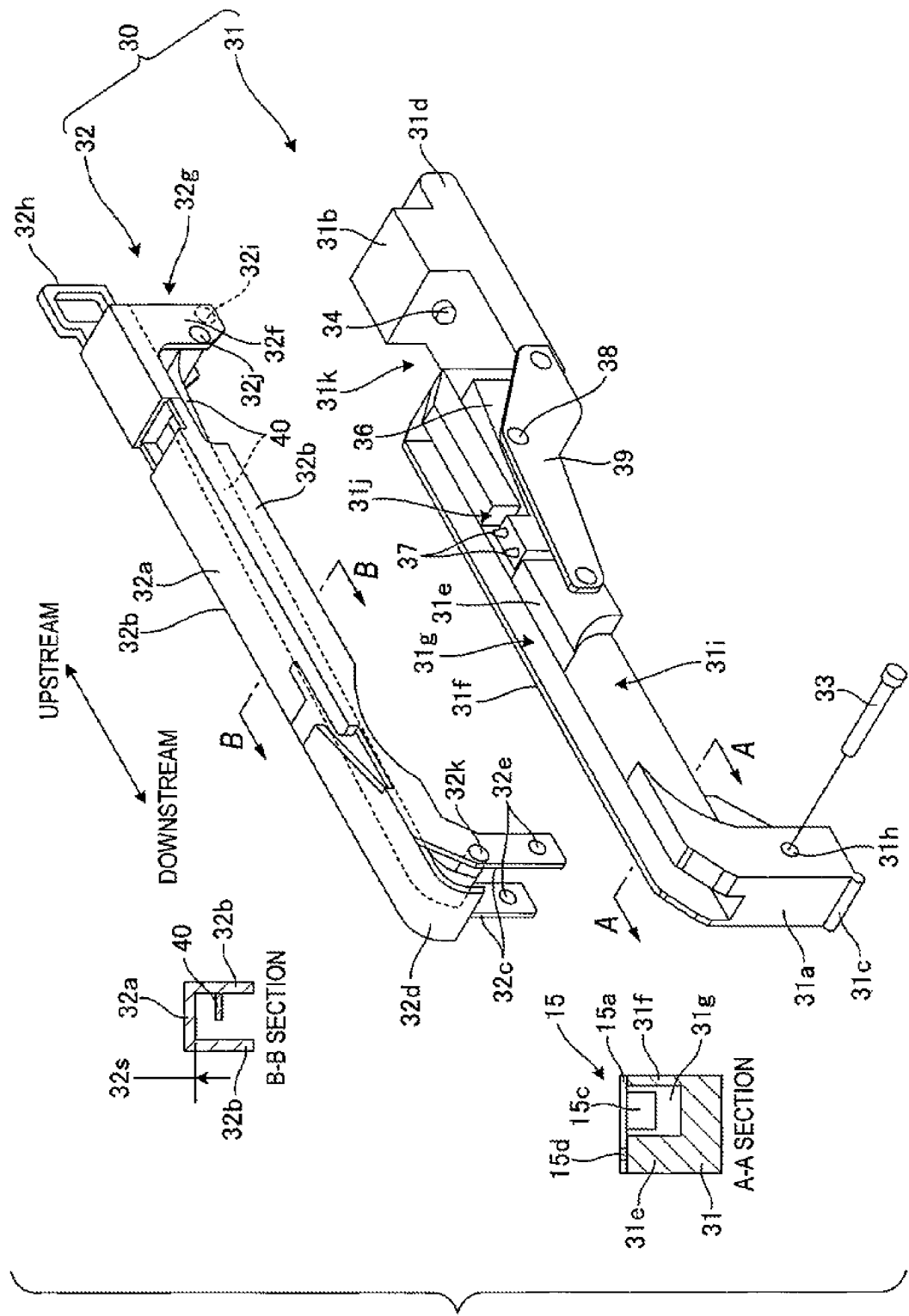
FIG. 5 is an illustrative figure of the structure of a guide part which is installed to the tape feeder of the embodiment of the invention.

Next, components that form the guide part 30 and the functions of these components are described with reference to FIGS. 5 to 8. As shown in FIG. 5, the guide part 30 includes the bottom member 31 and the top member 32. As shown in an A-A section, the bottom member 31 has such a structure that a groove 31g is formed on the top surface of a rectangular section member of a longitudinal shape that forms the main body of the bottom member 31, and the bottom member 31 has a function of supporting the carrier tape 15 from the bottom side with tape supporting parts 31e and 31f at the two sides of the groove 31g. When the carrier tape 15 is loaded on the bottom member 31, the embossed parts 15c are fitted in the groove 31g, the sending holes 15d are supported by the tape support part 31e in the range where the sending holes 15d are formed and the opposite end of the base tape 15a is supported by the tape supporting part 31f so that the sending of the tape is guided. In the case of a flat board-shaped paper tape which does not have the embossed parts 15c, the carrier tape 15 is also supported by the tape supporting parts 31e and 31f.

A downstream installing part 31a extends downward at the downstream end of the bottom member 31 (left side in FIG. 5), and an embedded part 31c is provided at the lower end of the downstream installing part 31a and has a shape that is fitted with an embedding recess 23a (refer to FIG. 8) of the downstream fitting part 23. An upstream installing part 31b extends at the upstream side (right side in FIG. 5) of the bottom member 31. A locked part 31d is provided at the front end of the bottom member 31 and has a shape lockable with a locking member 24a of the upstream locking part 24. When the guide part 30 is installed to the guide installing part 22 of the tape feeder 5, after the embedded part 31c is fitted with the embedding recess 23a of the downstream fitting part 23, the locked part 31d is locked by the locking member 24a.

When the guide part 30 is removed from the guide installing part 22 of the tape feeder 5, after the locking of the locked part 31d with the locking member 24a is released, the embedded part 31c is detached from the embedding recess 23a. Therefore, the embedded part 31c and the locked part 31d, which the bottom member 31 is provided with, form an attaching and detaching mechanism for attaching and detaching the bottom member 31. That is, in the structure of the guide part 30 in the present embodiment, the bottom member 31 has a function of guiding the bottom side of the carrier tape 15, and has such a structure that an attachment and detaching mechanism for attaching and detaching is provided.

A shape of the top member 32 is described. As shown in a B-B section in FIG. 5, the main part of the top member 32 is a longitudinal member which has a rectangular frame shape section that opens downwards, namely, a section in which side parts 32b extend upwards from two side ends of a horizontal top part 32a. The back surface of the top part 32a is a guide surface 32s for guiding the top surface of the carrier tape 15. The downstream end of the top member 32 is provided with pivot supporting plates 32c which are formed by extending the side parts 32b downwards and an upper cover part 32d which is formed by curving the top part 32a downwards and which covers the upper parts of the pivot supporting plates 32c. The pivot supporting plates 32c are provided with pivot holes 32e, and when the top member 32 is coupled to the bottom member 31, a pivot supporting pin 33 which is fitted with a pivot supporting hole 31h which the downstream installing part 31a is provided with is inserted through the pivot holes 32e so that the top member 32 is pivotally supported by the pivot supporting pin 33. Thereby, the top member 32 is coupled to the bottom member 31 in a freely opening/closing way.

That is, the pivot supporting hole 31h which the downstream installing part 31a is provided with, the pivot holes 32e which the pivot supporting plates 32c are provided with, and the pivot supporting pin 33 become an opening and closing mechanism for opening and closing the top member 32 relative to the bottom member 31. That is, the opening and closing mechanism opens and closes the top member 32 relative to the bottom member 31 by making the top member 32 to be pivoted around a pivot point (pivot supporting pin 33 fitted in the pivot supporting hole 31h) which is provided downstream in the tape sending direction in the bottom member 31.

A lower guide member 40 is disposed in the top member 32 in an almost full length range of the top member 32. One end of the lower guide member 40 is fixed to flexed parts 32f by a fixing member 32j, and the other end of the lower guide member 40 is fixed to the pivot supporting plates 32c by a fixing member 32k. The lower guide member 40 is located below the top part 32a in the B-B section, and corresponds to the position of the groove 31g in the bottom member 31. The lower guide member 40 is an elastic board member such as a leaf spring, and has a function of guiding the carrier tape 15 from below when the carrier tape 15 is installed to the top member 32 after the top member 32 is opened by the above-mentioned opening and closing mechanism from the bottom member 31.

When the top member 32 is closed relative to the bottom member 31, namely when the top member 32 is pivoted around the pivot supporting pin 33 and covers the upper part of the bottom member 31 (refer to FIG. 6(a)), the side parts 32b of the top member 32 are located beside the tape supporting parts 31e and 31f and guide the carrier tape 15 in a widthwise direction, and the guide surface 32s, which is the back surface of the top part 32a, is located on the top surface of the carrier tape 15 which is sent over the bottom member 31 and holds the carrier tape 15 down from above so that the top surface is guided (refer to a C-C section of FIG. 6(b)). That is, the top member 32 has a function of guiding the carrier tape 15 in a widthwise direction, and a function of guiding the top surface of the carrier tape 15 by holding the carrier tape 15 down from above with the guide surface 32s.

At the upstream of the top member 32, the side parts 32b become the flexed parts 32f which are extended and flexed downwards, and the space between the two flexed parts 32f forms a tape insertion opening 32g which is provided to open at the upstream and lead the carrier tape 15 inside. When the carrier tape 15 is set at the guide part 30, the front end of the carrier tape 15 is inserted from the tape insertion opening 32g, and the carrier tape 15 is guided by the lower guide member 40 which is provided inside the top member 32 and is led to the downstream in the top member 32. That is, the tape insertion opening 32g is provided at the upstream of the tape sending direction in the top member 32, and becomes a tape leading part which leads the carrier tape 15 into the top member 32.

Furthermore, the lower ends of the flexed parts 32l are provided with a locking pin 32i for locking, and when the top member 32 is closed to the bottom member 31, the flexed parts 32f fit into locking recess 31k which is provided at the downstream of the upstream installing part 31b. A locking member 34 of a pin shape which is biased downstream horizontally by a compression spring member 35 is installed to the upstream installing part 31b by being protruded in the locking recess 31k, and when the top member 32 is closed to the bottom member 31, the position of the top member 32 is fixed by locking the locking pin 32i with the locking member 34. The upstream end of the top member 32 is provided with a grasp ring 32h, and an operator grasps the grasp ring 32h to perform operations of pushing down and pulling up at the time of the opening and closing operations of the top member 32.

An escaping part 31*i* corresponding to the shape of the sprocket 20 is provided in the tape supporting part 31*e* in the range of interfering with the sprocket 20 when the guide part 30 is installed to the guide installing part 22, and a notch part 31*j* is provided in the tape supporting part 31*e* to incorporate a positioning mechanism described below. The notch part 31*j* is formed by partially cutting a part of the top surface of the tape supporting part 31*e*, and the notch part 31*j* is provided in a range where an aligning member 36 is accommodated, which is an elongated member, one end of which is bent upwards to be a pin mounting part 36*a*. The aligning member 36 is pivotally supported in the bottom member 31 by a pivot supporting pin 38, and one end of the pivot supporting pin 38 is supported by a support bracket 39 which is fixed to the side surface of the tape supporting part 31*e*. In figures other than FIG. 5, the illustration of the support bracket 39 is omitted. On the top surface of the pin mounting part 36*a*, one pair of aligning pins 37 are provided at an interval corresponding to the pitch between sending holes 15*d* in the carrier tape 15, and the aligning pins 37 can be exposed on the top surface of the tape supporting part 31*e* through the notch part 31*j*.

Figure 6:
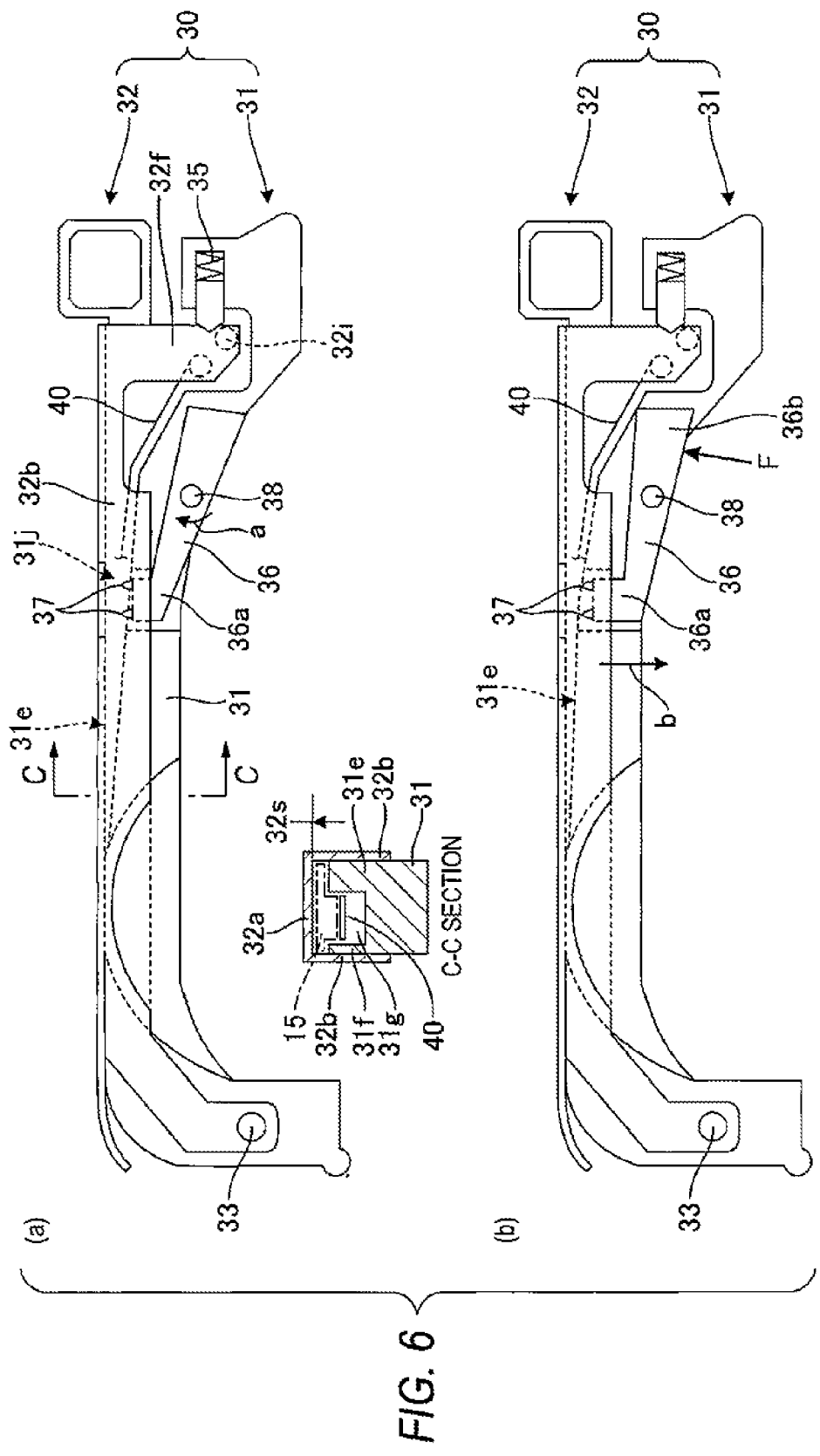
FIGS. 6(*a*) and 6(*b*) are illustrative figures of the function of the guide part which is installed to the tape feeder of the embodiment of the invention.

Next, the shape of the guide part 30 when the top member 32 is closed to the bottom member 31 and functions of the parts are described with reference to FIGS. 6(*a*), 6(*b*) and 7. FIG. 6(*a*) shows that the top member 32 is in a closed state relative to the bottom member 31 by being pivoted around the pivot supporting pin 33. At this time, the top member 32 is fixed by locking the locking pin 32*i* which is provided in the flexed parts 32*f* with the locking member 34. In this state, the aligning member 36 is biased in the counterclockwise direction (arrow a) around the pivot supporting pin 38 by a biasing unit (not shown in the figure), and the aligning pins 37 are protruded on the top surface of the tape supporting part 31*e* through the notch part 31*j*.

Thereby, when the guide part 30 is detached from the guide installing part 22, the aligning pins 37 which are always at fixed locations are fitted in the sending holes 15*d* of the carrier tape 15 which is led in the top member 32 and is held between the top member 32 and the bottom member 31, and the relative position of the guide part 30 and the carrier tape 15 in the tape sending direction is decided. Here, when the positions of the aligning pins 37 are decided, the sending holes 15*d* of the carrier tape 15 are set at positions where the sending pins 20*a* of the sprocket 20 are definitely engaged. Therefore, by installing and fixing the guide part 30 to the guide installing part 22 after the carrier tape 15 is positioned by the aligning pins 37, the carrier tape 15 is set at the position where the sending pins 20*a* of the sprocket 20 are engaged with the sending holes 15*d* without other position adjusting operations.

FIG. 6(*b*) shows that an external force F for releasing the fitting is applied from below to the opposite end 36*b* of the pin mounting part 36*a* in a condition shown in FIG. 6(*a*). That is, with this external force F, the aligning member 36 is pivoted around the pivot supporting pin 38 in the clockwise direction against the biasing force, and the pin mounting part 36*a* drops with the aligning pins 37 (arrow b) and is withdrawn from the top surface of the tape supporting part 31*e*. In this embodiment, in the guide installing part 22, a leaf spring member 26 (refer to FIG. 8) is disposed at the position corresponding to the end 36*b* opposite to the pin mounting part 36*a*. Thereby, when the guide part 30 is installed to the guide installing part 22, the leaf spring member 26 applies an upwards external force to the aligning member 36 (refer to FIG. 6(*b*)), and the aligning pins 37 leave from the sending holes 15*d* of the carrier tape 15. Therefore, the pitch sending of the carrier tape 15 is not obstructed by the aligning pins 37.

In the above-described structure, the aligning member 36 which is pivotally supported by the pivot supporting pin 38 and the aligning pins 37 which are provided at the pin mounting part 36*a* form a positioning mechanism which positions the relative position of the carrier tape 15 and the guide part 30 in the tape sending direction by making the aligning pins 37 to be engaged in the sending holes 15*d* of the carrier tape 15 in the guide part 30. The positioning mechanism is formed by providing the aligning pins 37 in the bottom member 31 in the present embodiment, and becomes a structure which includes a fitting releasing mechanism to make the aligning pins 37 to separate from the sending holes 15*d* when the bottom member 31 is installed to the guide installing part 22.

In the present embodiment, a structure example is shown in which a pivoting force is applied on the aligning member 36 by the leaf spring member 26 as a fitting releasing mechanism, but other mechanisms such as a compression spring may be used as the structure to make the aligning member 36 to move so that the pin mounting part 36*a* is dropped. In the present embodiment, a structure example is shown in which the positioning mechanism is provided in the bottom member 31, but the positioning mechanism may be provided in the top member 32 as long as the structure has a function of positioning the relative position of the carrier tape 15 and the guide part 30 in the tape sending direction.

Figure 7:
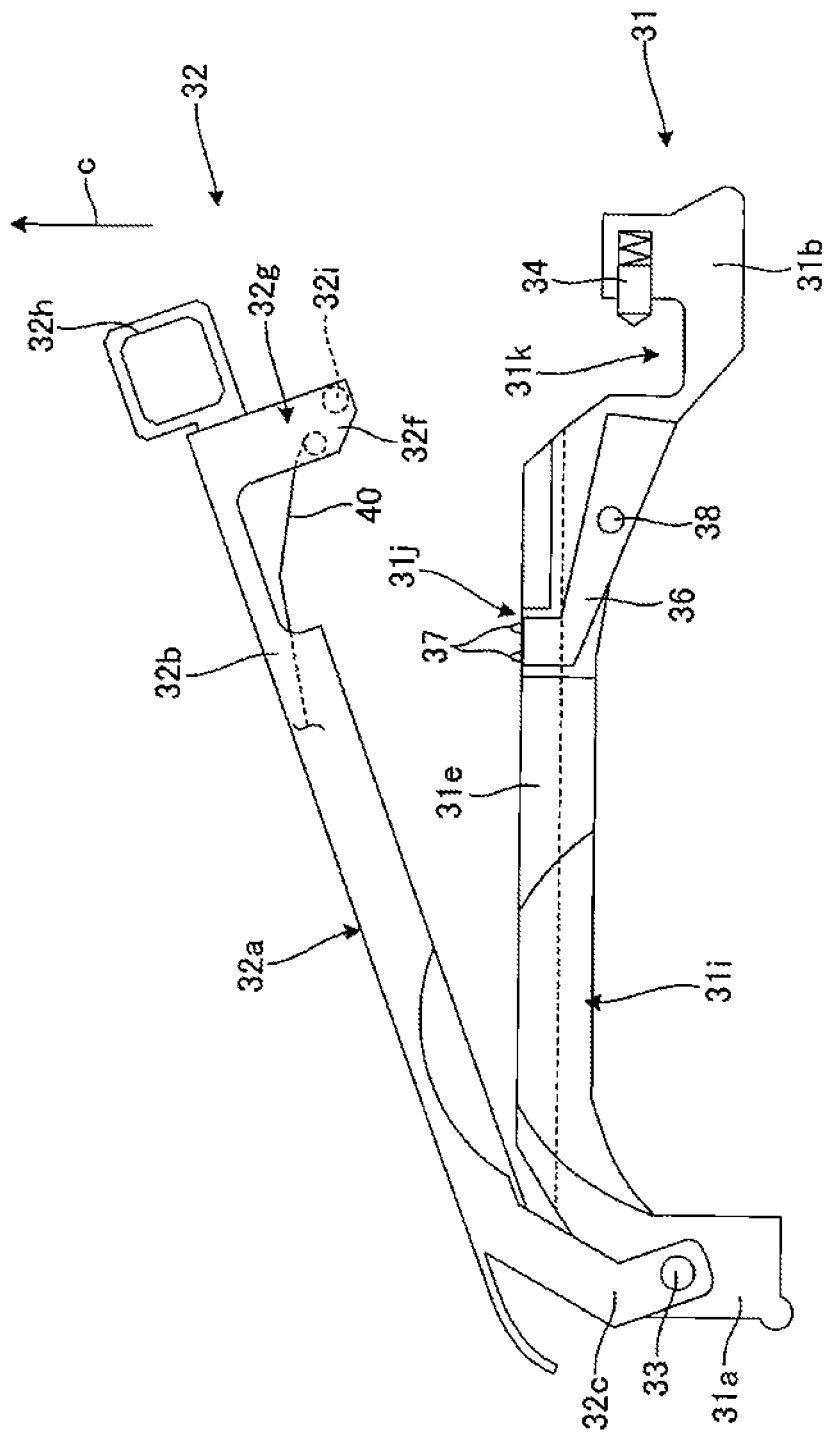
FIG. 7 is an illustrative figure of the function of the guide part which is installed to the tape feeder of the embodiment of the invention.

FIG. 7 shows a state that the guide part 30 is opened by making the top member 32 to be pivoted around the pivot supporting pin 33 by pulling up the grasp ring 32*h* (arrow c), and the setting of a new carrier tape 15 is performed in this state. In this state, the aligning pins 37 are protruded on the top surface of the tape supporting part 31*e* through the notch part 31*j*, and this state is a state that the carrier tape 15 can be aligned. The carrier tape 15, which is led into the top member 32, is positioned in the tape sending direction relative to the guide part 30 when the aligning pins 37 are fitted in the sending holes 15*d* by closing the top member 32.

Figure 8:
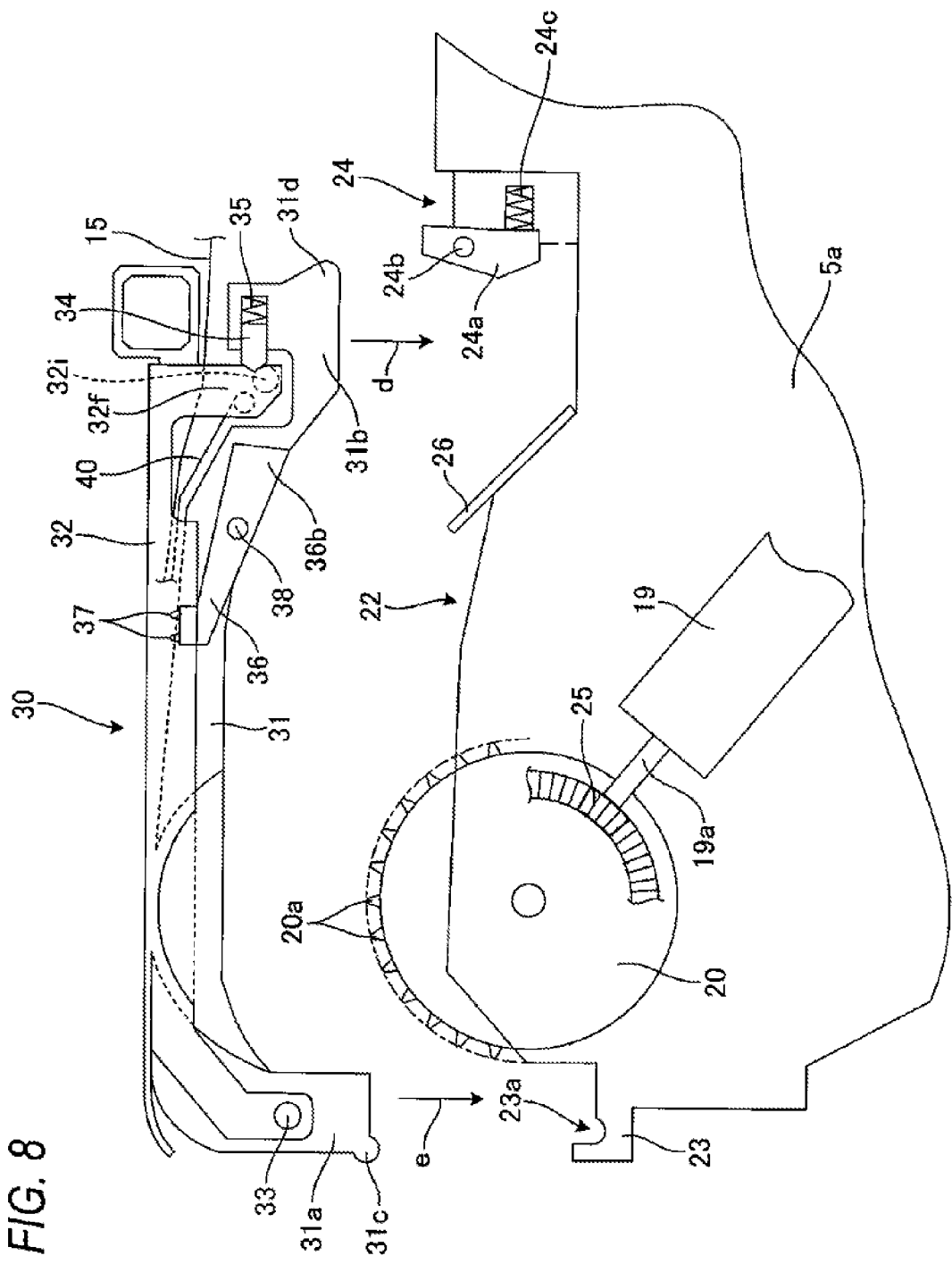
FIG. 8 is an illustrative figure of the function of the guide part which is installed to the tape feeder of the embodiment of the invention.

FIG. 8 shows an action of installing the guide part 30 to the guide installing part 22 when the bottom member 31 and the top member 32 are closed in this way. In this installing operation, when the downstream installing part 31*a* is aligned with the downstream fitting part 23 and the upstream installing part 31*b* is aligned with the upstream locking part, first, the downstream installing part 31*a* is dropped (arrow d) so that the embedded part 31*c* is fitted with the embedding recess 23*a*, and then the upstream installing part 31*b* is dropped (arrow e) so that the locked part 31*d* is locked by the locking member 24*a*. At this time, it is desired that aligning pins that more precisely position the downstream installing part 31*a* and the upstream installing part 31*b* are provided in the downstream fitting part 23 and upstream locking part 24, and are fitted with fitting holes provided in the downstream installing part 31*a* and the upstream installing part 31*b*. Thus, in this state, the leaf spring member 26, which the guide installing part 22 is provided with, butts against the opposite end 36*b* of the aligning member 36 from below so that an external force for releasing the fitting of the aligning pins 37 is applied to the opposite end 36*b*, and thus the aligning pins 37 are withdrawn from the top surface of the tape supporting part 31*e*.

Figure 9:
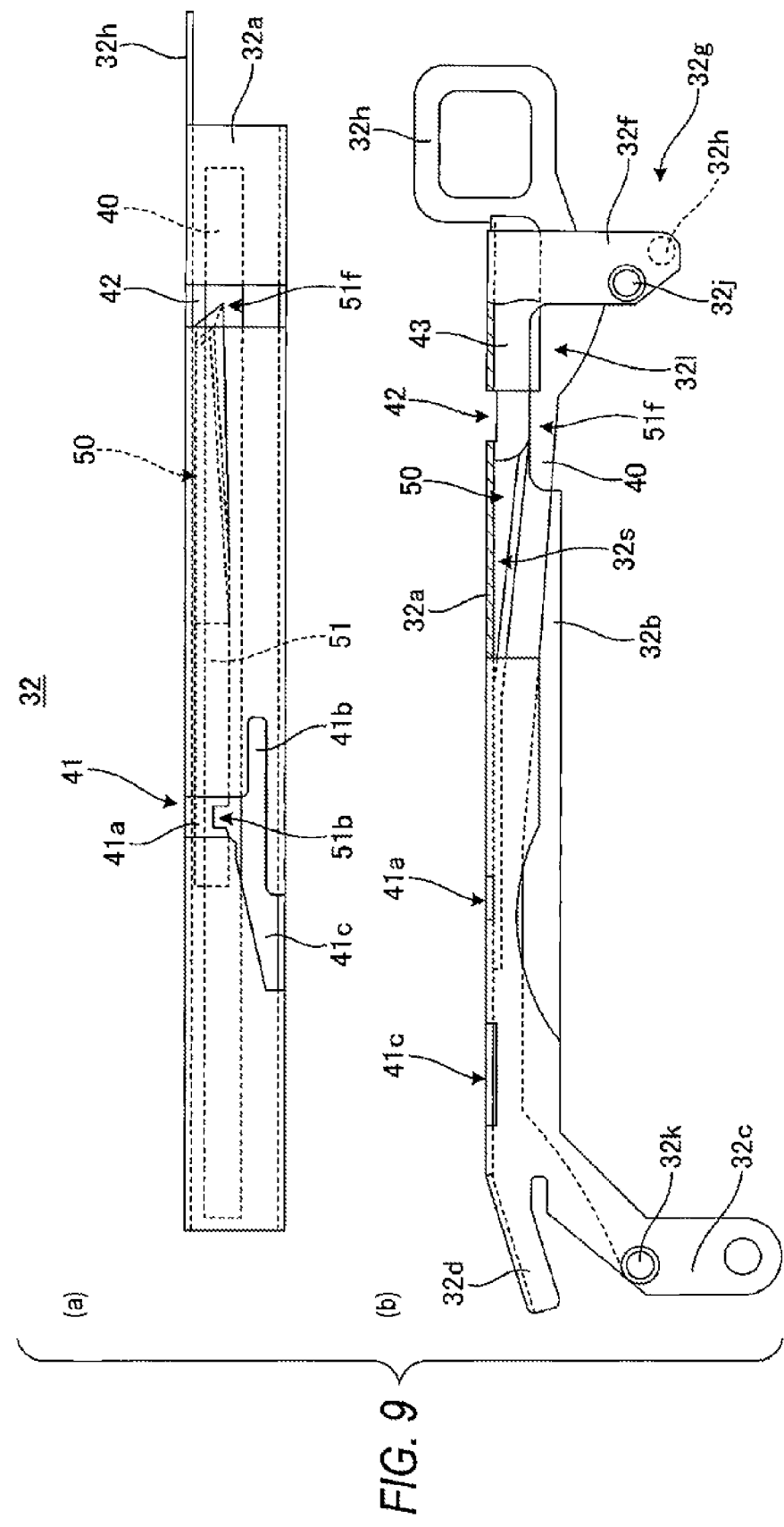
FIGS. 9(*a*) and 9(*b*) are illustrative figures of the structure of a top member of the guide part which is installed to the tape feeder of the embodiment of the invention.

Next, the structure of a cover tape exfoliating mechanism 50 which is provided in the top member 32 of the guide part 30 is described with reference to FIGS. 9(*a*) to 11(*c*). FIG. 9(*a*) shows a top view of the top member 32, and the top part 32*a* is provided with a first opening 41 and a second opening 42. The first opening 41 includes a component takeout opening 41a where an electronic component 16 which is held on the carrier tape 15 is picked up by the adsorbing nozzle 8a, a pin escaping opening 41b for avoiding the interference of the sending pins 20a of the sprocket 20 with the top part 32a, and a tape escaping opening 41c for preventing the cover tape 15e from being caught to the component takeout opening 41a at the time of the tape exfoliation to be described below. The second opening 42 is used as a recognition opening to visually recognize an exfoliation state when the cover tape 15e is exfoliated from the carrier tape 15 by the cover tape exfoliating mechanism 50 described below.

As shown in FIG. 9(b), the cover tape exfoliating mechanism 50 is provided at the guide surface 32s which is the back surface of the top part 32a of the top member 32. The cover tape exfoliating mechanism 50 has a function of exfoliating the cover tape 15e from one side where the component pockets 15b are provided from the base tape 15a of the carrier tape 15 to make the electronic components 16 in the component pockets 15b to be exposed (refer to FIG. 13(e)). That is, the cover tape exfoliating mechanism 50 exfoliates the joining surface from one side in an exfoliation object range R which at least includes the component pocket 15b (refer to FIG. 13(e)) by intervening between the joining surfaces of the base tape 15a and the cover tape 15e in the pitch sending of the carrier tape 15, and includes a first exfoliating member 51 and a second exfoliating member 52 described below.

As described in detail in the movement explanation to be described below, the cover tape exfoliating mechanism 50 makes the cover tape 15e in the pickup position to be folded toward the base tape 15a to a planar shape, by making the cover tape 15e, which is exfoliated from the base tape 15a with the first exfoliating member 51 and the second exfoliating member 52, to be bent with one side towards the other side, and pressing the bent cover tape 15e from the bottom side to the guide surface 32s of the top member 32 in the process of guiding the carrier tape 15 to the pickup position.

The tape exfoliation is started when the carrier tape 15 which is led in from the tape insertion opening 32g arrives at the upstream end of the cover tape exfoliating mechanism 50, but to make an exfoliating knife tip 51f which is provided at the front end of the cover tape exfoliating mechanism 50 to definitely enter between the joining surfaces of the base tape 15a and the cover tape 15e at this time, a notch part 32l is provided in a predetermined range equivalent to the vicinity of the exfoliating knife tip 51f in the side parts 32b. The notch part 32l is provided for an operation of making the joining surface of the carrier tape 15 which is inserted from the tape insertion opening 32g to be surely aligned with the cover tape exfoliating mechanism 50 by the lower guide member 40. That is, with the notch part 32l, the lower guide member 40 can be lifted with the pushing up movement of a finger of an operator or by a mechanical pushing up mechanism disposed in the top member 32.

Figure 10:
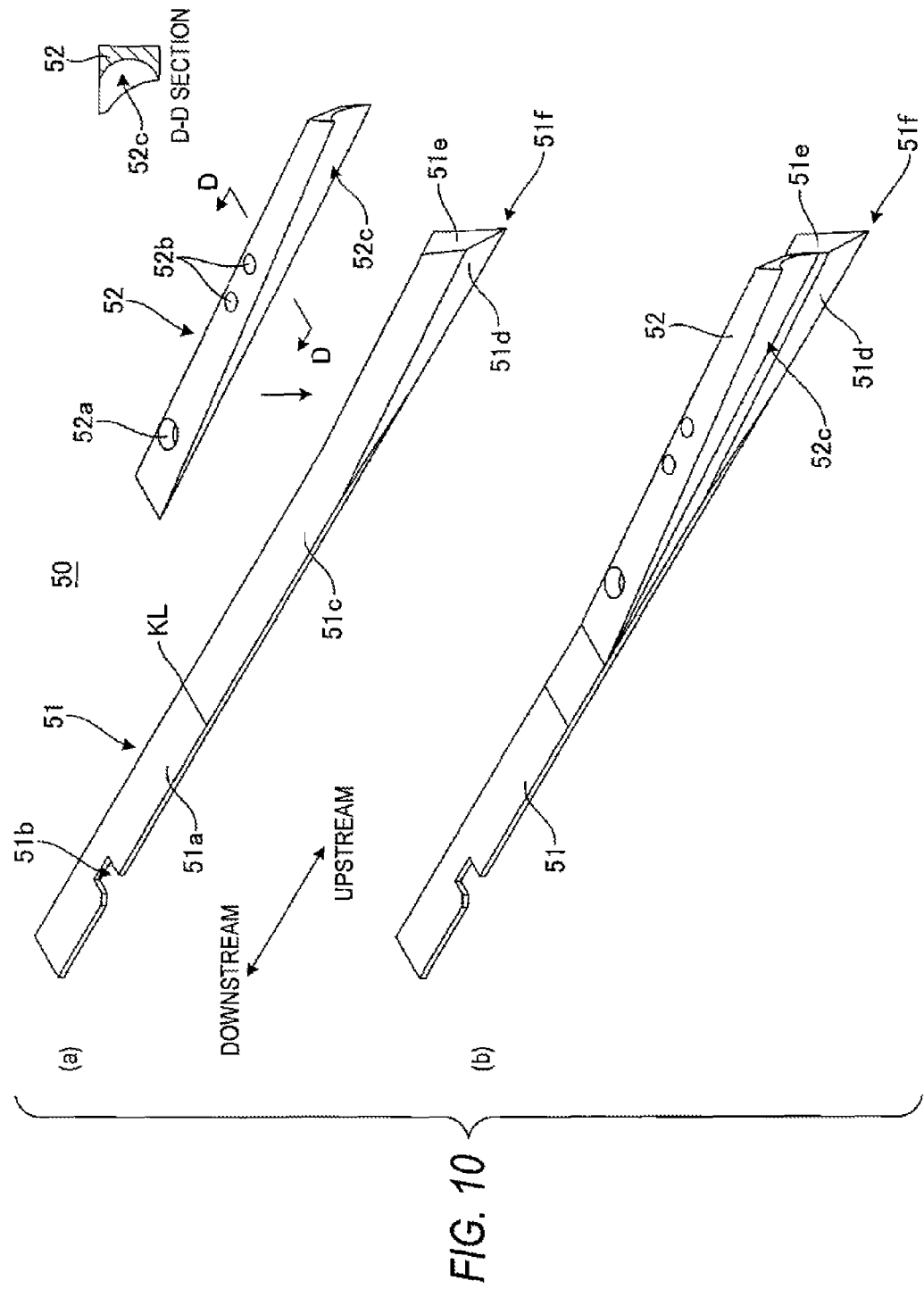
FIGS. 10(*a*) and 10(*b*) are illustrative figures of the shapes of an exfoliating member of a tape exfoliating mechanism which is assembled to the guide part of the tape feeder of the embodiment of the invention.

As shown in FIGS. 10(a) and 10(b), the cover tape exfoliating mechanism 50 is formed by overlaying the second exfoliating member 52 which is manufactured from a metal rod on the top surface of the first exfoliating member 51 which is manufactured from a metal plate. The first exfoliating member 51 is a board member of a slim shape which has a folding part KL in the middle, and includes a horizontal part 51a which is at the downstream of the folding part KL, and a ramp part 51c which is at the upstream of the folding part KL. The horizontal part 51a is provided with a component takeout part 51b where electronic components 16 are taken out. A side knife tip 51d and a front knife tip 51e, which are edge cut to a tapered shape, respectively, are provided at the upstream side end and the front end of the ramp part 51c, and the intersection points of the side knife tip 51d and the front knife tip 51e become the exfoliating knife tip 51f of an acuminate shape. As discussed below, in a tape exfoliating process, the exfoliating knife tip 51f enters between the joining surfaces of the base tape 15a and the cover tape 15e.

The second exfoliating member 52 is a rod-like member having a base shape that corresponds to the top surface of the ramp part 51c of the first exfoliating member 51. As shown in the D-D section, the side surface of the second exfoliating member 52 is provided with a concave conical surface 52c of a tapered shape such as an inner conical surface whose radius of curvature tapers towards downstream. The top surface of the second exfoliating member 52 is provided with a positioning hole 52a and attaching screw holes 52b for attaching to the top member 32. The concave conical surface 52c functions as a flexure working surface to make the cover tape 15e to be flexed towards a folding direction when the cover tape 15e, which is exfoliated by the exfoliating knife tip 51f and tape sent to the downstream, butts against the concave conical surface 52c.

The cover tape exfoliating mechanism 50 is formed by making the bottom surface of the second exfoliating member 52 to butt against the ramp part 51c of the first exfoliating member 51 and adhering the first exfoliating member and the second exfoliating member with bonding methods such as brazing. In this state, the horizontal part 51a has the same surface as the top surface of the second exfoliating member 52, and the front knife tip 51e and the exfoliating knife tip 51f are protruded from the front end of the second exfoliating member 52 to the upstream, and the side knife tip 51d is bulged out from the side of the second exfoliating member 52.

Figure 11:
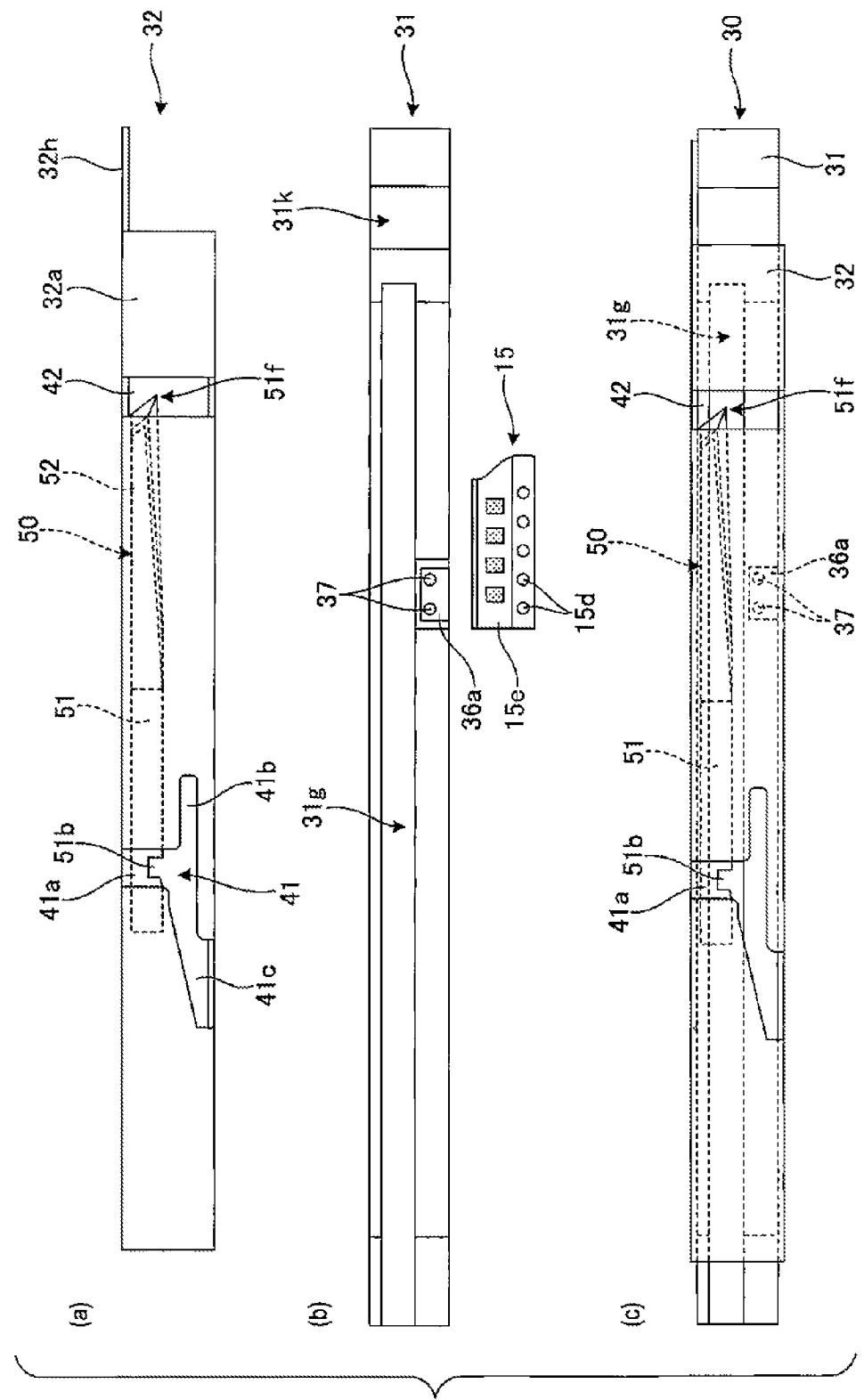
FIGS. 11(*a*) to 11(*c*) are illustrative figures of an arrangement of the tape exfoliating mechanism which is assembled to the guide part of the tape feeder of the embodiment of the invention.

When the cover tape exfoliating mechanism 50 is installed to the top member 32, by aligning the positioning hole 52a and the attaching screw holes 52b to the top member 32 and threadedly engaging fixing bolts into the attaching screw holes 52b through the top part 32a, the cover tape exfoliating mechanism 50 is fixed and installed to the top member 32. In this state, as shown in FIG. 11(a), the component takeout part 51b corresponds to the component drawout opening 41a of the top part 32a, and the exfoliating knife tip 51f is located below the second opening 42. Thus, in an installed state that the top member 32 is closed to the bottom member 31 shown in FIG. 11(b), the exfoliating knife tip 51f of the cover tape exfoliating mechanism 50 is located above the groove 31g of the bottom member 31, as shown in FIG. 11(c).

Thereby, the cover tape exfoliating mechanism 50 is located near the aligning pins 37, which are provided at the pin mounting part 36a which is the positioning mechanism of the carrier tape 15, in the widthwise direction of the carrier tape 15, and the positioning mechanism and the cover tape exfoliating mechanism 50 are disposed at non-interference positions where the positioning mechanism and the cover tape exfoliating mechanism 50 do not interfere mutually. By arranging the cover tape exfoliating mechanism 50 and the positioning mechanism, the longitudinal dimension increase of the guide part 30 is prevented and the compact guide part 30 becomes feasible.

Figure 12:
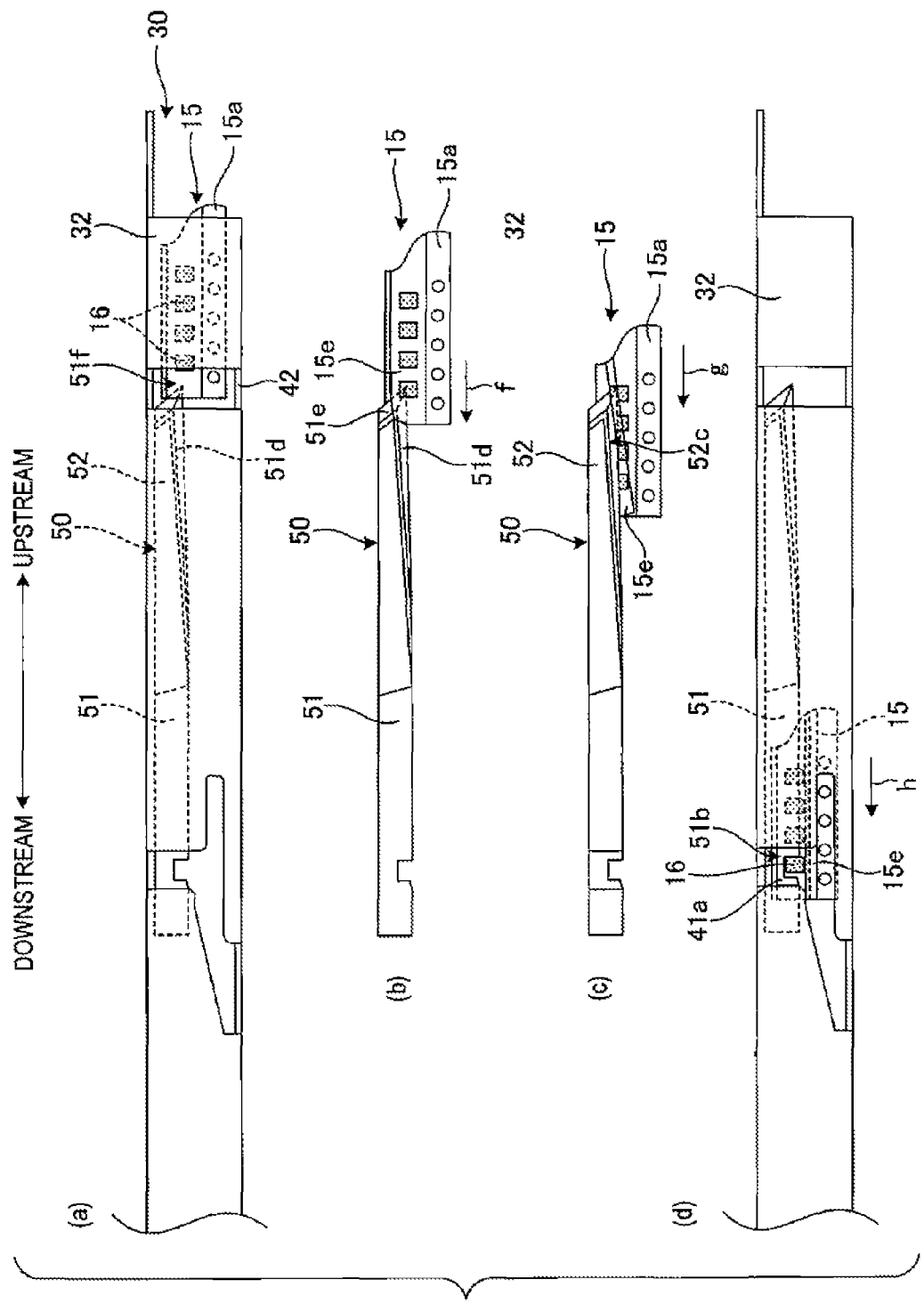
FIGS. 12(*a*) to 12(*d*) are illustrative figures of tape exfoliating actions in the tape feeder of the embodiment of the invention.

Next, a tape exfoliating process of the cover tape 15e with the cover tape exfoliating mechanism 50 is described with reference to FIGS. 12(a) to 12(d) and 13(a) to 13(e). FIG. 12(a) shows that in the guide part 30 in which the top member 32 is opened (refer to FIG. 7), the front end of the carrier tape 15 which is inserted from the tape insertion opening 32g arrives at the exfoliating knife tip 51f of the cover tape exfoliating mechanism 50, and can be viewed from the second opening 42. In this state, the carrier tape 15 is lifted by the lower guide member 40 from below, and as shown in FIG.

13(a), the exfoliating knife tip 51f enters between the joining surfaces of the base tape 15a and the cover tape 15e, and thereby the tape exfoliation is started.

That is, as shown in FIG. 12(b), when the carrier tape 15 is tape sent to the downstream side (arrow f), the side knife tip 51d and the front knife tip 51e which are formed at two sides of the exfoliating knife tip 51f intervene between the joining surfaces of the base tape 15a and the cover tape 15e, and the cover tape exfoliating mechanism 50 and the carrier tape 15 move relative to each other. Thereby, as shown in FIG. 13(b), the cover tape 15e is exfoliated from one side (the right side in FIG. 13(b)) where the component pocket 15b is provided in the base tape 15a. The cover tape 15e which is exfoliated, and partially becomes an upright state from the base tape 15a butts against the concave conical surface 52c, and is flexed to the other side (in FIG. 13(b) the left side) opposite to the one side with the flexure working of the concave conical surface 52c. Thus, as shown in FIG. 12(c), by further tape sending the carrier tape 15 (arrow g), the exfoliated range of the cover tape 15e is enlarged following the knife range of the side knife tip 51d. Meanwhile, as shown in FIG. 13(c), the base tape 15a is rised when the carrier tape 15 is pushed up and rised by the lower guide member 40 along the sloping bottom surface of the first exfoliating member 51. The flexure degree of the exfoliated cover tape 15e increases when the cover tape 15e which is exfoliated with this rise follows the concave conical surface 52c of a tapered shape and is pushed up.

As shown in FIG. 12(d), the carrier tape 15 is further tape sent (arrow h), and when the electronic component 16 to be adsorbed arrives at the component takeout opening 41a corresponding to the pickup position, the carrier tape 15 becomes adjacent to the guide surface 32s of the top part 32a. Thereby, the cover tape 15e whose flexure degree gradually increases, as shown in FIG. 13(d), is pressed from the bottom side to the guide surface 32s, and is folded to the base tape 15a to a planar shape. In this state, as shown in FIG. 13(e), the cover tape 15e is completely exfoliated in the exfoliation object range R which is set to include the component pocket 15b, and the electronic component 16 which arrives at the position of the component takeout part 51b in the component takeout opening 41a is exposed at the top side.

When the adsorbing nozzle 8a (refer to FIG. 3) performs a pickup action on the electronic component 16 exposed in this way, the electronic component 16 is vacuum adsorbed and taken out. In this pickup action, because the cover tape 15e is folded into a planar shape, compared with the prior art in which a pickup action is performed when the exfoliated cover tape 15e is in an upright state, it is possible to set the up and down stroke of the adsorbing nozzle 8a, which is required for the pickup action, to be smaller. Thereby, defects with the increase of the up and down stroke, for example, a drop of component adsorption precision due to nozzle installation precision and due to the horizontal position deviation which is produced when the nozzle moves up and down, can be prevented.

The cover tape exfoliating mechanism 50 which is provided in the guide part 30 shown in the present embodiment has a structure which has the first exfoliating member 51 and the second exfoliating member 52 which exfoliate the joining surface from one side in the exfoliation object range R which at least includes the recess part by intervening between the joining surfaces of the base tape 15a and the cover tape 15e in the pitch sending of the carrier tape 15. While the cover tape 15e which is exfoliated from the base tape 15a by the first exfoliating member 51 and the second exfoliating member 52 is flexed with one side towards the other side, in the process of guiding the carrier tape 15 to the component takeout opening 41a corresponding to the pickup position, by pressing the flexed cover tape 15e from the bottom side to the guide surface 32s of the top member 32, the cover tape 15e in the pickup position is folded towards the base tape 15a to a planar shape.

That is, the first exfoliating member 51 and the second exfoliating member 52 which form the cover tape exfoliating mechanism 50 has an exfoliating knife tip 51f which is provided at the upstream end in the tape sending direction with an acuminate shape and which enters between the joining surfaces of the base tape 15a and the cover tape 15e, and a concave conical surface 52c of a tapered shape towards the pickup position which functions as a flexure working surface against which the cover tape 15e, which is exfoliated by the exfoliating knife tip 51f and pitch sent to the downstream, butts so that the cover tape 15e is flexed to the folding direction.

In this tape exfoliation, because the cover tape exfoliating mechanism 50 as described above is located near the positioning mechanism of the carrier tape 15, which includes the pin mounting part 36a and the aligning pins 37, in the widthwise direction of the carrier tape 15, when the cover tape 15e is exfoliated from the base tape 15a, the carrier tape 15 is positioned horizontally by the positioning mechanism. That is, the base tape 15a, whose position tends to become unstable after the cover tape 15e is exfoliated, can be definitely fixed by the aligning pins 37, and the carrier tape 15 can be easily aligned to the guide part 30 precisely.

Next, with reference to FIGS. 14(a), 14(b), 15(a) and 15(b), pushing up unit are described which push up the lower guide member 40 from the bottom side, in an exfoliation start position where the exfoliation is started when the exfoliating knife tip 51f at the front end of the cover tape exfoliating mechanism enters between the joining surfaces of the base tape 15a and the cover tape 15e. In the tape exfoliation in the guide part 30 shown in the present embodiment, it is important to make the exfoliating knife tip 51f to enter between the joining surfaces surely when the front end of the carrier tape 15 arrives at the cover tape exfoliating mechanism 50. Herein, the pushing up unit which pushes up the lower guide member 40, which guides the carrier tape 15 from the bottom side, from the bottom side is included at the exfoliation start position where the exfoliating knife tip 51f starts to exfoliate the joining surface, namely, the position where the front end of the carrier tape 15 which is inserted from the tape insertion opening 32g arrives at the exfoliating knife tip 51f.

That is, when the carrier tape 15 is installed to the top member 32, the carrier tape 15 which is an installed object is pushed up together with the lower guide member 40 by the pushing up unit to make the joining surfaces to be properly aligned to the height of the exfoliating knife tip 51f in the exfoliation start position and to make the exfoliating knife tip 51f to definitely enter between the joining surfaces. At this time, the top surface of the carrier tape 15 is pressed from below to the pressing member 43 which is provided in the upstream at a predetermined interval from the exfoliating knife tip 51f, and the exfoliation of the cover tape 15e from the base tape 15a is inhibited in a range where the pressing member 43 is butted against. Thereby, the falling of the electronic components 16 because the cover tape 15e is exfoliated and the component pocket 15b is opened is prevented. That is, the pressing member 43 functions as an exfoliation preventing mechanism which inhibit the exfoliation of the cover tape 15e from the base tape 15a which has not yet arrived at the cover tape exfoliating mechanism 50 by pressing the cover tape 15e down from the top side.

An operator can visually recognize the alignment of the exfoliating knife tip 51*f* and the carrier tape 15 through the second opening 42 which the top member 32 is provided with. That is, the second opening 42, which is formed between the pressing member 43 which is the exfoliation preventing mechanism and the cover tape exfoliating mechanism 50 in the top member 32, functions as a recognition opening with which the exfoliation state of the cover tape with this cover tape exfoliating mechanism is visually recognized by partially removing the top surface of the top member 32.

Figure 14:
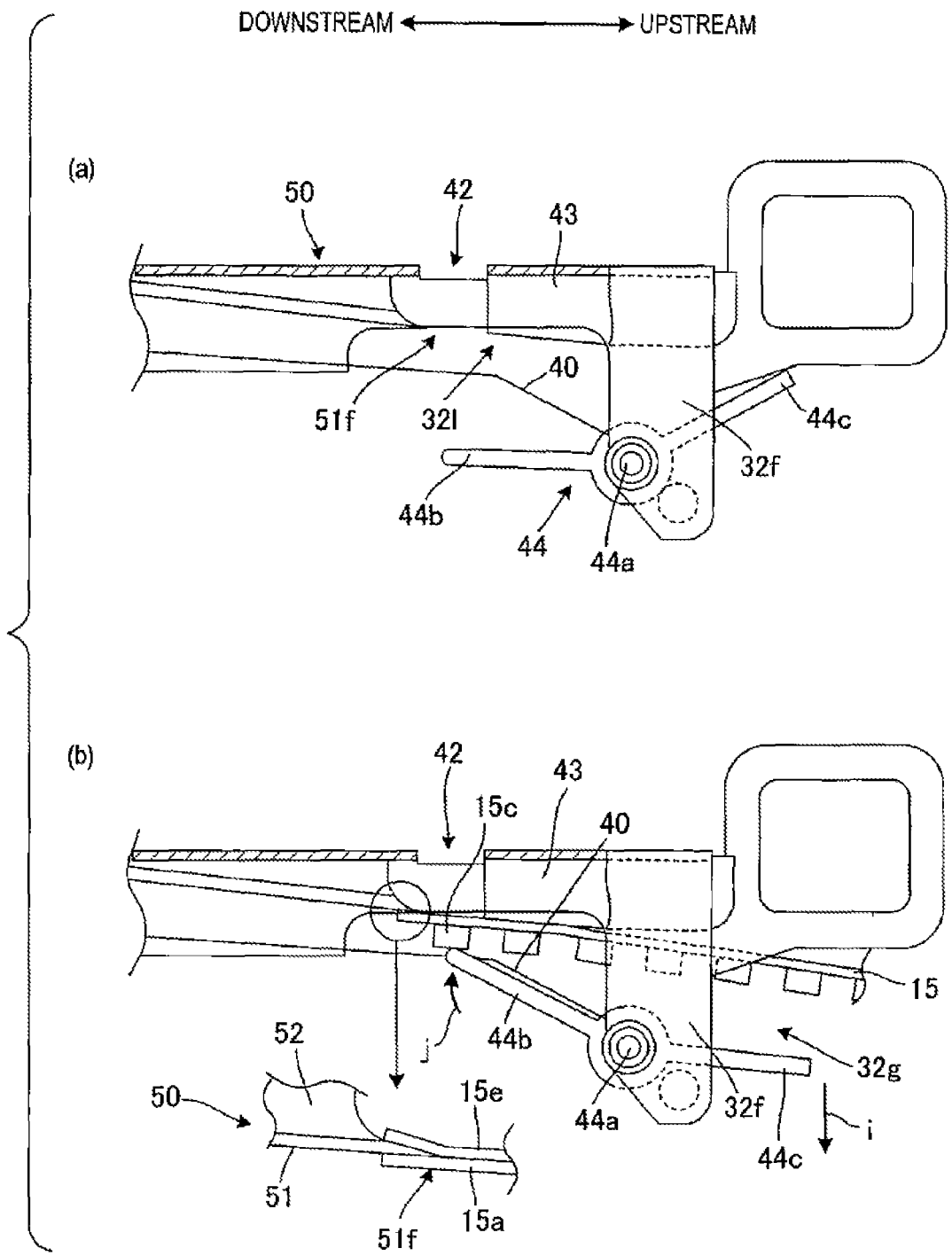
FIGS. 14(*a*) and 14(*b*) are illustrative figures of the structure and function of a pushing up unit that pushes up the carrier tape together with a lower guide member in the tape exfoliating mechanism of the tape feeder of the embodiment of the invention.

First, with reference to FIGS. 14(*a*) and 14(*b*), a structure for pushing up the lower guide member 40 using a hand-operated lever member 44 (lever member) which is disposed at the flexed parts 32*f* is described. In FIG. 14(*a*), in the flexed parts 32*f*, the lever member 44 which has an abutment end 44*b* and an operation end 44*c* which are extended upstream and downstream, respectively, is pivotally supported rotatably around a pivot supporting pin 44*a* which is provided in the central part. The abutment end 44*b* is extended into the notch part 32*l*, and is at the position near and below the second opening 42 where the lower guide member 40 can be pushed up from below. The operation end 44*c* is extended from the flexed parts 32*f* to the upstream, and is at the position where an operator can perform a pushing down operation.

FIG. 14(*b*) shows a state that the carrier tape 15 is installed to the top member 32 through the tape insertion opening 32*g*. At this time, an operator performs an operation of pushing down the operation end 44*c* before the front end of the carrier tape 15 arrives at the exfoliating knife tip 51*f* (arrow i). Thereby, the abutment end 44*b* is rised (arrow j), butts against the lower guide member 40, and lifts the carrier tape 15 together with the embossed part 15*c*. Thereby, the top surface of the carrier tape 15 is positioned in height by being pressed against the bottom surface of the pressing member 43, and in this state the carrier tape 15 is sent to the downstream so that the exfoliating knife tip 51*f* of the cover tape exfoliating mechanism 50 properly enters between the joining surfaces of the base tape 15*a* and the cover tape 15*e*, and a normal exfoliation is started. That is, in the example shown in the FIGS. 14(*a*) and 14(*b*), the pushing up unit is supported in the flexed parts 32*f* of the top member 32, and is formed so that the lower guide member 40 is pushed up from the bottom side when an operator operates the operation end 44*c* (the other end) of the provided lever member 44 (lever member) so that the abutment end 44*b* (one end) butts against the bottom surface of the lower guide member 40.

Figure 15:
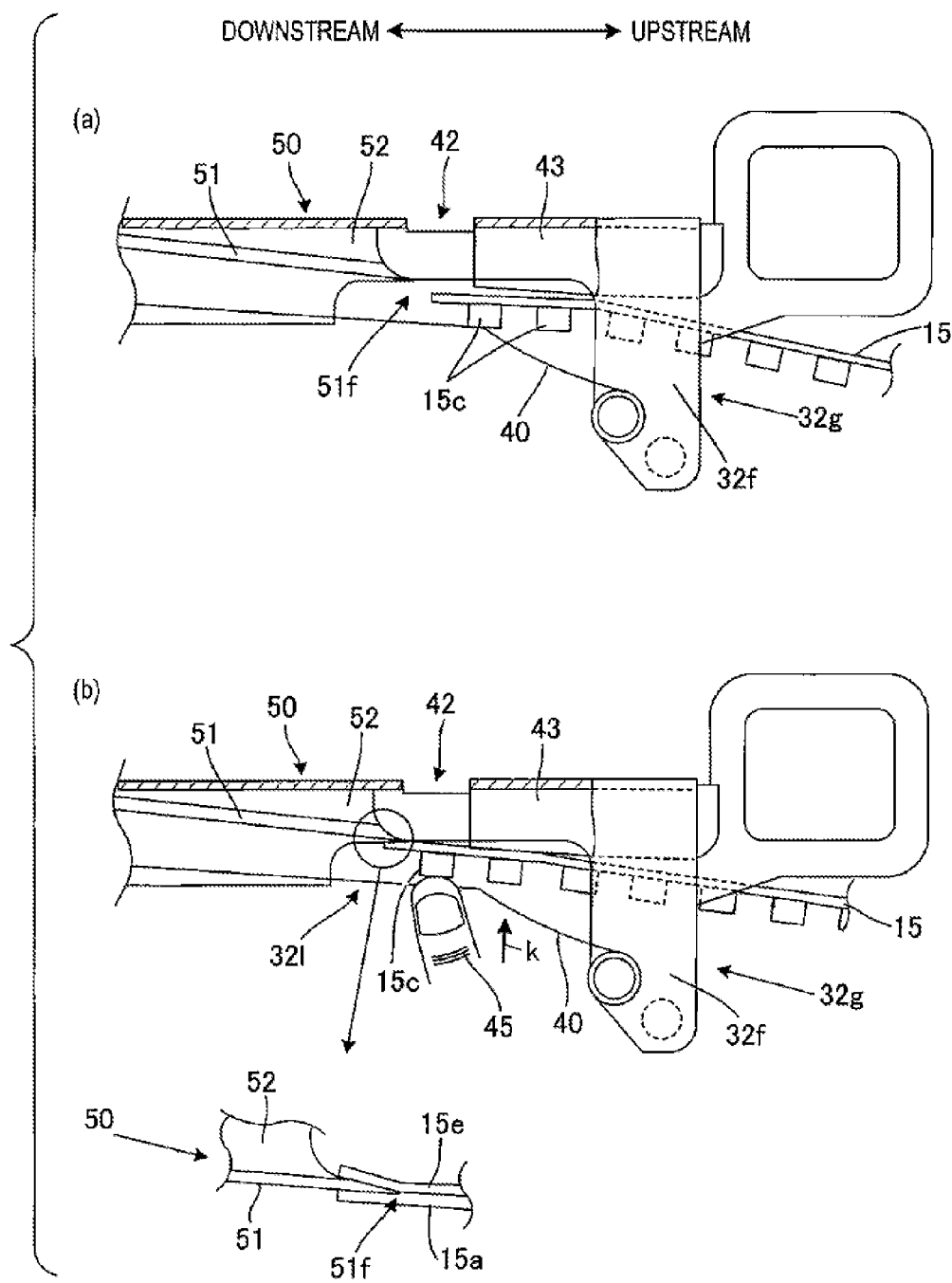
FIGS. 15(*a*) and 15(*b*) are illustrative figures of the structure and function of a pushing up unit that pushes up the carrier tape together with the lower guide member in the tape exfoliating mechanism of the tape feeder of the embodiment of the invention.

Next, with reference to FIGS. 15(*a*) and 15(*b*), an example is described in which an operator performs an operation of lifting the lower guide member 40 by using a finger. Herein, by means of the notch part 32*l* which the top member 32 is provided with, a finger can be used to access the lower guide member 40. FIG. 15(*a*) shows a state that the carrier tape 15 is installed to the top member 32 by being inserted through the tape insertion opening 32*g*. At this time, due to the thickness or the shape of the embossed part 15*c*, the lower guide member 40 may not lift and guide the embossed part 15*c* appropriately, and it is possible that the joining surfaces of the base tape 15*a* and the cover tape 15*e* may not properly align to the exfoliating knife tip 51*f*.

In such case, the operator views through the second opening 42, as shown in FIG. 15(*b*), makes a finger 45 to enter into the notch part 32*l*, lifts the lower guide member 40 with the finger 45 and tape sends the carrier tape 15 to the downstream. Thereby, the top surface of the carrier tape 15 is positioned in height by being pressed against the bottom surface of the pressing member 43, and in this state the carrier tape 15 is sent to the downstream so that the exfoliating knife tip 51*f* of the cover tape exfoliating mechanism 50 properly enters between the joining surfaces of the base tape 15*a* and the cover tape 15*e*, and a normal exfoliation is started. That is, in the example shown in the FIGS. 15(*a*) and 15(*b*), the pushing up unit is formed so that the operator pushes up the lower guide member 40 with the finger 45 from the bottom side through the notch part 32*l* which is provided in the top member 32 so that the finger 45 of the operator can access the lower guide member 40 in the top member.

Figure 16:
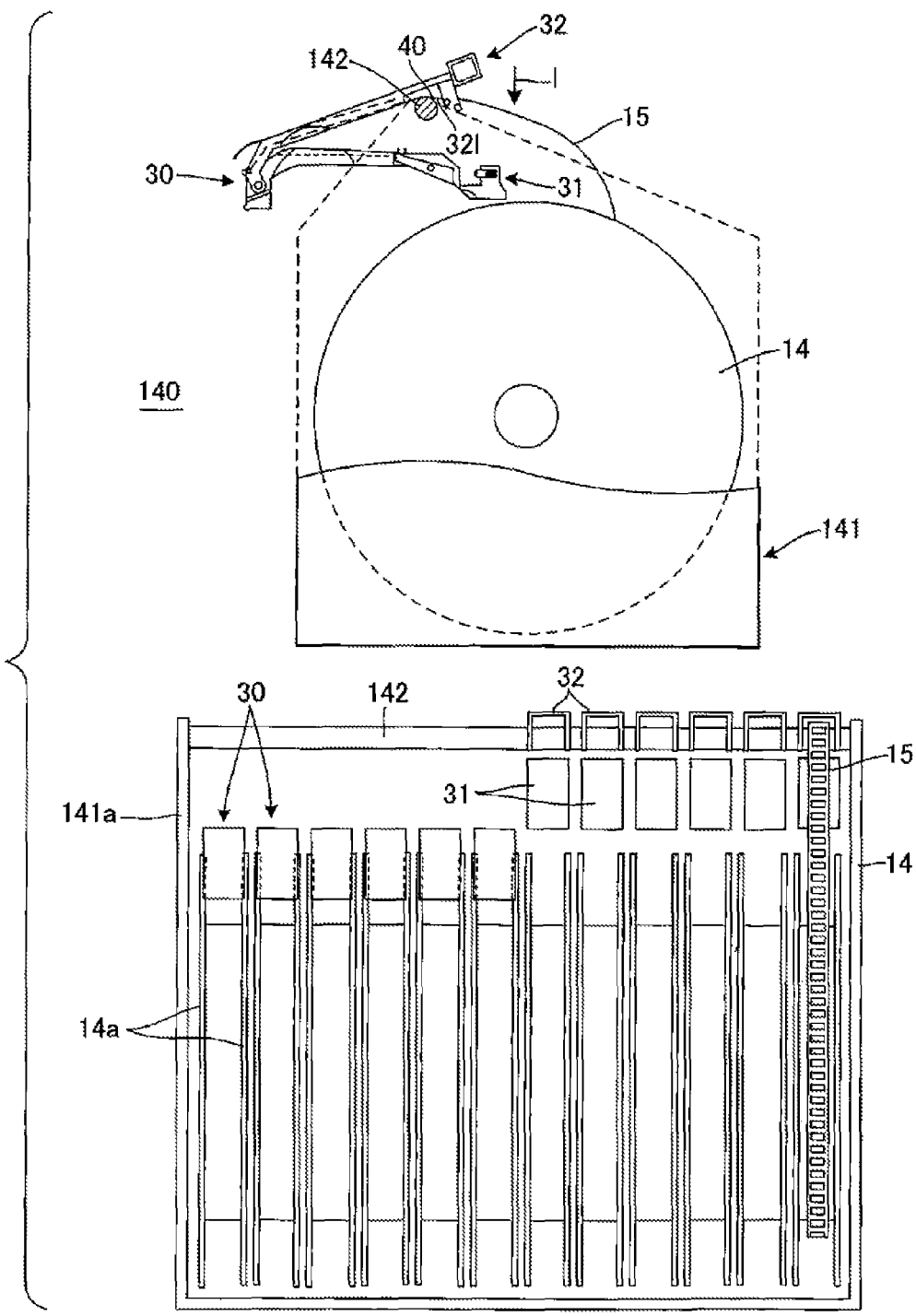
FIG. 16 is an illustrative figure of the structure and function of a pushing up unit that pushes up the carrier tape together with the lower guide member in the tape exfoliating mechanism of the tape feeder of the embodiment of the invention.

Structures other than those shown in FIGS. 14(*a*) and 14(*b*) and FIGS. 15(*a*) and 15(*b*) are also possible as long as the same function is achieved. For example, FIG. 16 shows an example of reel keeping unit 140 which collectively keeps a plurality of tape reels 14 into each of which a guide part 30 is installed beforehand. The reel keeping unit has a function of keeping the plurality of tape reels 14 by arranging in parallel and co-axially, and has a structure that accommodates and keeps the guide parts 30 in accordance with the tape reels 14 by making the bottom members 31 to be fitted in reel side plates 14*a* of the tape reels 14. The plurality of tape reels 14 are arranged in a box-like container 141, and a pressed rod 142 is laterally built across the tops of two side parts 141*a* of the box-like container 141.

When the carrier tape 15 is installed to the top member 32 in such a state, the top member 32 is dropped from the upper part of the pressed rod 142 and the pressed rod 142 is located in the notch part 32*l*. By gradually pushing down the top member 32, the lower guide member 40 is butted against the pressed rod 142 and the lower guide member 40 is pushed up relative to the top member 32. Thereby, the carrier tape 15 is aligned to the cover tape exfoliating mechanism 50 in the height direction, and the same effect as that of the examples shown in FIGS. 14(*a*) and 14(*b*) and FIGS. 15(*a*) and 15(*b*) is obtained.

Next, with reference to FIGS. 17(*a*) to 17(*c*) and 18(*a*) to 18(*b*), a tape installing method which installs a new carrier tape 15 into the tape feeder 5 is described. First, when the guide part 30 is detached from the body part 5*a*, the carrier tape 15 is introduced into the top member 32 from the tape insertion opening 32*g* (tape introducing step). As shown in FIG. 17(*a*), this operation is performed when the guide part 30 is opened by drawing out the flexed parts 32*f* from the locking recess 31*k* and making the top member 32 to be pivoted relative to the bottom member 31 (arrow m).

In the tape introducing step, when the carrier tape 5 is installed to the top member 32, by pushing up the carrier tape 15 to be installed together with the lower guide member 40 from the bottom side in the exfoliation start position where the exfoliating knife tip 51*f* which is provided at the upstream end of the first exfoliating member 51 in the pitch sending direction with an acuminate shape starts to exfoliate the joining surface, the exfoliating knife tip 51*f* in the exfoliation start position is aligned and made to enter between the joining surfaces. The pushing up of the lower guide member 40 is performed with any of the methods shown in FIGS. 14(*a*) and 14(*b*) and FIGS. 15(*a*) and 15(*b*).

Figure 13:
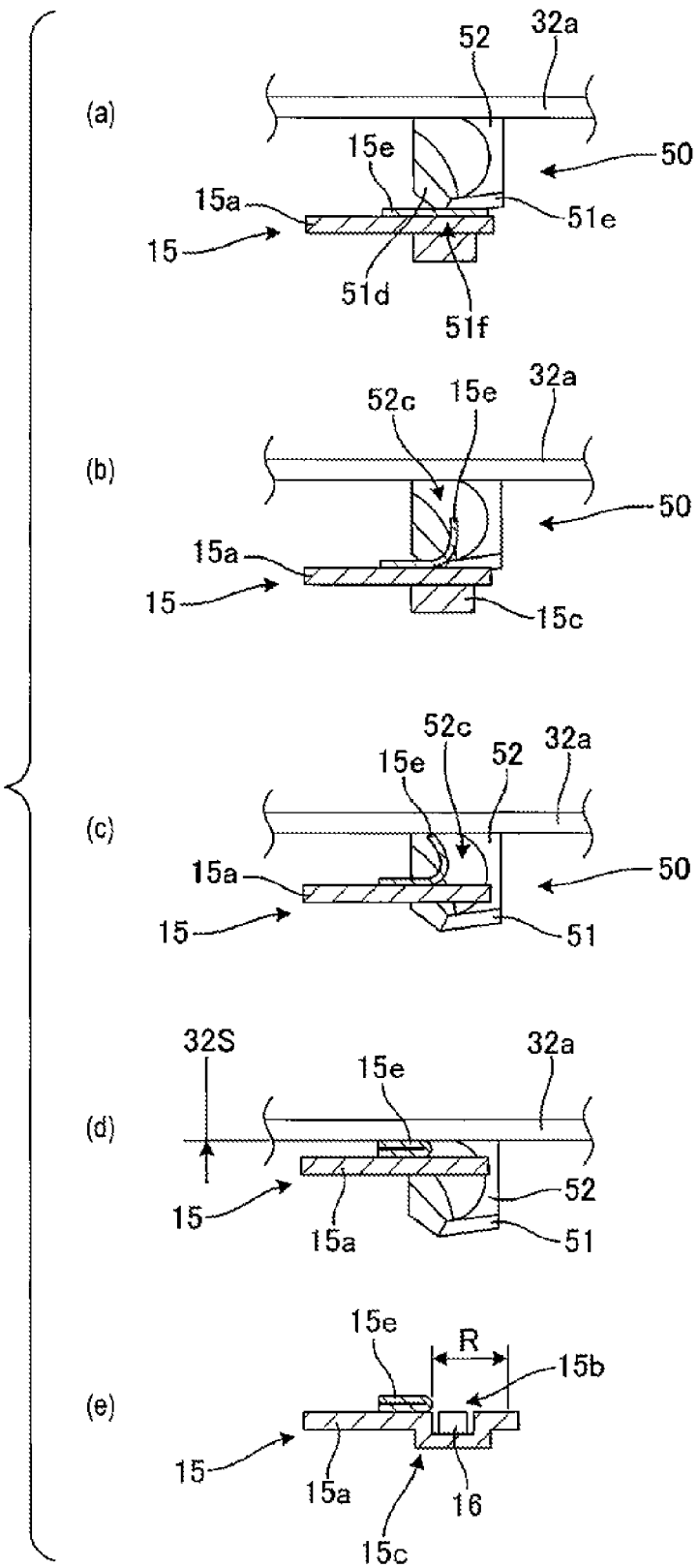
FIGS. 13(*a*) to 13(*e*) are illustrative figures of tape exfoliating actions in the tape feeder of the embodiment of the invention.

After this, by sending the carrier tape 15 from the exfoliation start position to the downstream, the tape exfoliation is performed by the cover tape exfoliating mechanism 50. That is, when the carrier tape 15 is introduced into the top member 32, as shown in FIGS. 13(*c*) to 13(*e*), while the cover tape 15*e* which is exfoliated from the base tape 15*a* by the first exfoliating member 51 is flexed with one side of the component pocket 15*b* towards the other side, in the process of guiding the carrier tape 15 to the component takeout opening 41*a* which is provided to correspond to the pickup position, by pressing the flexed cover tape 15*e* from the bottom side to the guide surface 32s of the top member 32, the cover tape 15e in the pickup position is folded towards the base tape 15a to a planar shape.

In the tape exfoliation, the exfoliation of the cover tape 15e from the base tape 15a which has not yet arrived at the cover tape exfoliating mechanism 50 is inhibited by pressing the carrier tape 15 from above with the pressing member 43 which is disposed at the upstream of the cover tape exfoliating mechanism 50. Therefore, defects such as component standing that the electronic component 16 in the component pocket 15b is in an upright posture, or component falling that the electronic components 16 falls out from the component pocket 15b which is in an opened state are prevented. In the process after the tape introducing step, an operator visually recognizes the exfoliation state of the cover tape 15e with the cover tape exfoliating mechanism 50 from the second opening 42 which is a recognition opening that is provided by partially removing the part of the top surface of the top member 32 between the cover tape exfoliating mechanism 50 and the pressing member 43. Thereby, defects can be prevented by monitoring the outbreak of troubles such as exfoliation abnormality.

Then, by making the aligning pins 37 to be fitted in the sending holes 15d of the introduced carrier tape 15, the relative position in the tape sending direction of the carrier tape 15 and the guide part 30 is aligned (aligning step). That is, as shown in FIG. 17(b), the position of the carrier tape 15 is adjusted so that the positions of the sending holes 15d correspond to the aligning pins 37, and by closing the top member 32 to the bottom member 31, the aligning pins 37 is fitted in the sending holes 15d.

Then, as shown in FIG. 17(c), the top member 32 is closed to the bottom member 31. At this time, because the positioning mechanism including the aligning pins 37 and the pin mounting part 36 and the cover tape exfoliating mechanism 50 are arranged as shown in FIGS. 11(a) to 11(c), the top member 32 can be integrated with the bottom member 31 without making the positioning mechanism and the cover tape exfoliating mechanism 50 to be interfered mutually. Thereby, in the guide part 30 which is in a top-bottom-integrated condition, a new carrier tape 15 is set by being properly positioned in the tape sending direction when the feeding operation is completed after the front part of the cover tape 15e is exfoliated by the cover tape exfoliating mechanism 50. The installing of the carrier tape 15 is performed in this state.

Figure 18:
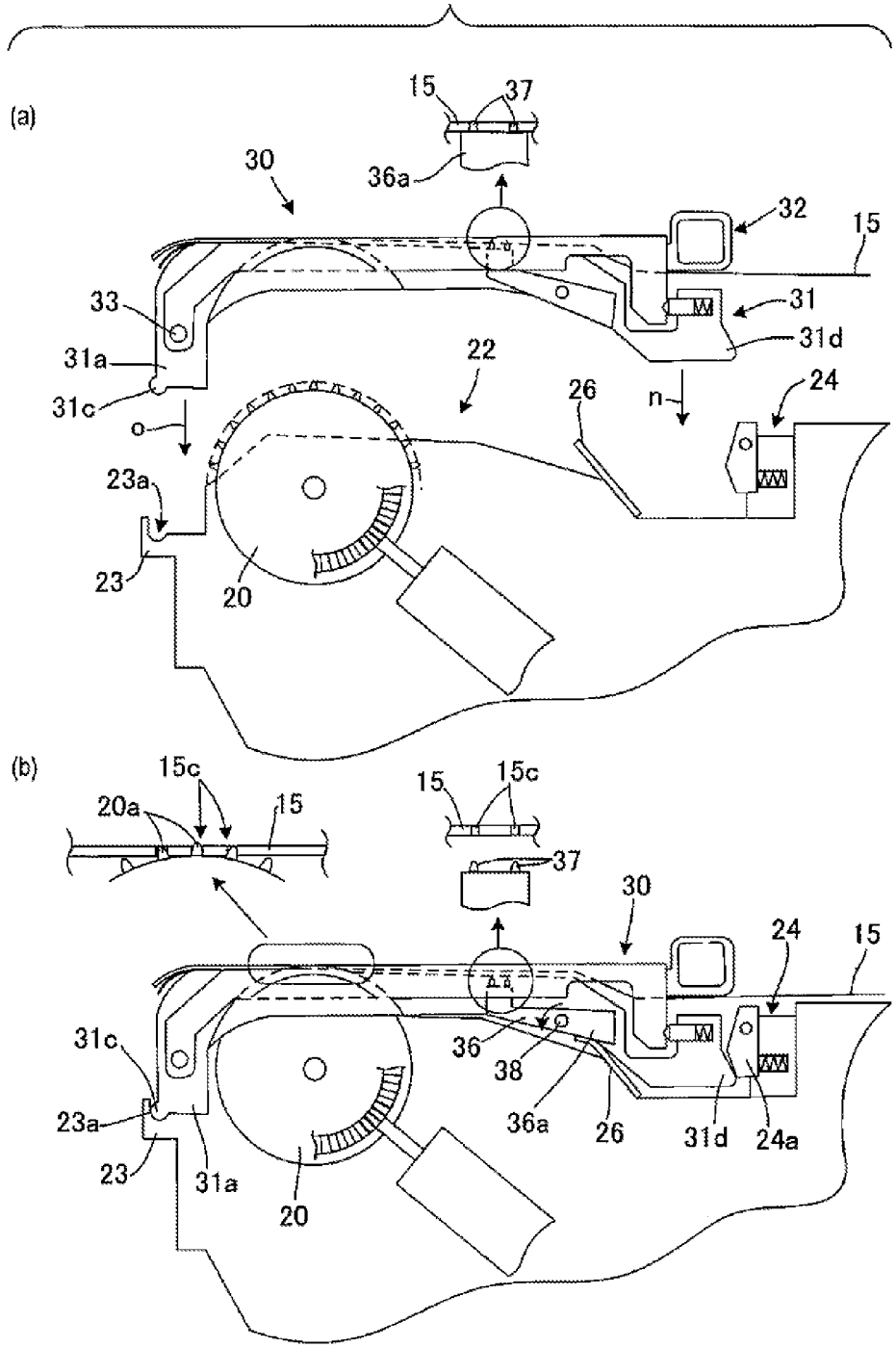
FIGS. 18(*a*) to 18(*b*) are illustrative figures of steps of the tape installing method in the tape feeder of the embodiment of the invention.

That is, as shown in FIG. 18(a), after the guide part 30 to which the carrier tape 15 is installed is aligned to the guide installing part 22, the guide part 30 is installed and fixed (guide part fixing step). In the guide part fixing step, as shown in FIG. 8, when the downstream installing part 31a is aligned with the downstream fitting part 23 and the upstream installing part 31b is aligned with the upstream locking part, first, the downstream installing part 31a is dropped (arrow n), and then the upstream installing part 31b is dropped (arrow o). FIG. 18(b) shows a state that the guide part fixing step is completed in this way. That is, by making the embedded part 31c to be fitted in the embedding recess 23a in the downstream fitting part 23, and locking the locked part 31d with the locking member 24a in the upstream locking part 24, the guide part 30 is fixed to the guide installing part 22. Thereby, the leaf spring member 26 butts against the pin mounting part 36a, and the aligning pins 37 are withdrawn downward and separated from the sending holes 15d of the carrier tape 15, so that the positioning is released and the tape sending of the carrier tape 15 can be performed. Meanwhile, the sending pins 20a in the sprocket 20 are engaged with the sending holes 15d of the carrier tape 15, and the pitch sending of the carrier tape 15 can be performed.

As described above, in the structure that the joining surface is exfoliated in the pitch sending of the carrier tape 15 by making the first exfoliating member 51 and the second exfoliating member 52 intervene between the joining surfaces of the base tape 15a and the cover tape 15e, the tape feeder 5 shown in the present embodiment includes a pushing up unit that pushes up the lower guide member, which guides the carrier tape 15 from below, from the bottom side in the exfoliation start position where the exfoliating knife tip 51f which is provided at the front end of the first exfoliating member 51 with an acuminate shape starts to exfoliate the joining surface, and when the carrier tape 15 is installed, the carrier tape 15 is pushed up together with the lower guide member 40 by the pushing up unit to make the exfoliating knife tip 51f in the exfoliation start position to be aligned to the joining surfaces and enter between the joining surfaces. Thereby, the alignment in the carrier tape installing operation is facilitated, and the operativity and operation efficiency can be improved.

Although the present invention is described in detail with reference to the embodiments, it is apparent that various modifications and amendments may be made by those skilled in the art without departing from the spirit and scope of the invention.

This application is based on the Japanese patent application (patent application No. 2011-012605) filed on Jan. 25, 2011, whose content is incorporated herein by reference.

INDUSTRIAL APPLICABILITY

The tape feeder and the tape installing method in the tape feeder of the present invention have effects of making it easy to align in the carrier tape installing operation and improving the operativity and the operation efficiency, to and are useful in the component mounting field in which electronic components are taken out from the tape feeder and mounted on boards.

DESCRIPTION OF THE SYMBOLS 1 component mounting device
3 board
4 component supply part
5 tape feeder
5a body part
5d tape path
8 transferring head
15 carrier tape
15b component pocket
15d sending hole
15e cover tape
16 electronic component
17 tape sending part
19 sending motor
20 sprocket
20a sending pin
22 guide installing part
23 downstream fitting part
24 upstream locking part
30 guide part
31 bottom member
31a downstream installing part
31b upstream installing part
31c embedded part
31d locked part 31e tape supporting part
32 top member
32a top part
32b side part
32c pivot supporting plate
32g tape insertion opening
32l notch part
32s guide surface
33 pivot supporting pin
34 locking member
36 aligning member
37 aligning pin
38 pivot supporting pin
40 lower guide member
41 first opening
42 second opening
43 pressing member
44 lever member
50 cover tape exfoliating mechanism
51 first exfoliating member
51f exfoliating knife tip
52 second exfoliating member
52c concave conical surface (flexure working surface)
R exfoliation object range

The invention claimed is:

1. A tape feeder which sequentially supplies electronic components to a pickup position of a transferring head by pitch sending a carrier tape which holds the electronic components in component accommodating recesses, comprising
   a body part which is provided with a tape path which leads the carrier tape which comprises a base tape in which the recesses are formed and a top tape which is attached onto the top surface of the base tape by covering the recesses,
   a tape sending mechanism which is provided in the body part and pitch sends the carrier tape at a predetermined pitch by making a sprocket to be intermittently rotated when sending pins of the sprocket are engaged with sending holes which are provided in the base tape, and
   a guide part which guides the carrier tape which is sent by the tape sending mechanism in a predetermined range including the pickup position on the body part and is formed to be attachable and detachable to and from the body part, wherein the guide part comprises a bottom member which guides the bottom side of the carrier tape, and is provided with an attaching and detaching mechanism for attaching and detaching to and from the body part,
   a top member which guides the carrier tape in a widthwise direction and guides the top surface of the carrier tape by pressing the carrier tape down from above with a guide surface,
   an opening and closing mechanism which opens and closes the top member relative to the bottom member, a lower guide member which is provided in the top member and guides the carrier tape from below when the carrier tape is installed to the top member after the top member is opened from the bottom member by the opening and closing mechanism,
   an exfoliating member which is provided at the guide surface of the top member and makes a joining surface to be exfoliated in an exfoliation object range at least including the recesses by intervening between the joining surfaces of the base tape and the top tape in the pitch sending of the carrier tape, and
   a pushing up unit which pushes up the lower guide member from the bottom side in an exfoliation start position where an exfoliating knife tip of an acuminate shape which is provided at the upstream end of the exfoliating member in the pitch sending direction starts to exfoliate the joining surface,
   wherein, when the carrier tape is installed to the top member, the carrier tape to be installed is pushed up together with the lower guide member by the pushing up unit to make the exfoliating knife tip in the exfoliation start position to be aligned to the joining surfaces and enter between the joining surfaces.

2. The tape feeder according to claim 1, wherein the pushing up unit is pivotally supported on the top member, and is formed so that the lower guide member is pushed up from the bottom side when an operator operates one end of a lever member which is provided so that the other end butts against the bottom surface of the lower guide member.

3. The tape feeder according to claim 1, wherein the pushing up unit is formed so that an operator pushes up the lower guide member with a finger from the bottom side through a notch part which is provided in the top member so that the finger of the operator can access the lower guide member in the top member.

4. A tape installing method in a tape feeder which sequentially supplies electronic components to a pickup position of a transferring head by pitch sending a carrier tape which holds the electronic components in component accommodating recesses, and comprises a body part which is provided with a tape path which leads the carrier tape which comprises a base tape in which the component accommodating recesses are formed and a top tape which is attached onto the top surface of the base tape by covering the recesses, a tape sending mechanism which is provided in the body part and pitch sends the carrier tape at a predetermined pitch by making a sprocket to be intermittently rotated when sending pins of the sprocket are engaged with sending holes which are provided in the base tape, and a guide part which guides the carrier tape which is sent by the tape sending mechanism in a predetermined range including the pickup position on the body part and is formed to be attachable and detachable to and from the body part, wherein the guide part comprises a bottom member which guides the bottom side of the carrier tape, and is provided with an attaching and detaching mechanism for attaching and detaching to and from the body part, a top member which guides the carrier tape in a widthwise direction and guides the top surface of the carrier tape by pressing the carrier tape down from above with a guide surface, an opening and closing mechanism which opens and closes the top member relative to the bottom member, a lower guide member which is provided in the top member and guides the carrier tape from below when the carrier tape is installed to the top member after the top member is opened from the bottom member by the opening and closing mechanism, and an exfoliating member which is provided at the guide surface of the top member and makes a joining surface to be exfoliated in an exfoliation object range at least including the recesses by intervening between the joining surfaces of the base tape and the top tape in the pitch sending of the carrier tape, and
   wherein the tape installing method installs the carrier tape to the tape feeder and
   in a tape introducing step of introducing the carrier tape into the guide part after the guide part is detached from the body part, when the carrier tape is installed to the top member, in an exfoliation start position where an exfoliating knife tip of an acuminate shape which is provided at the upstream end of the exfoliating member in the pitch sending direction starts to exfoliate the joining surface, the carrier tape to be installed is pushed up together with the lower guide member to make the exfoliating knife tip in the exfoliation start position to be aligned to the joining surfaces and enter between the joining surfaces.

5. The tape installing method in the tape feeder according to claim 4, wherein an operator operates one end of a lever member which is pivotally supported on the top member and which is provided so that the other end of the lever member butts against the bottom surface of the lower guide member, so that the lower guide member is pushed up from the bottom side.

6. The tape installing method in the tape feeder according to claim 4, wherein an operator pushes up the lower guide member from the bottom side with a finger through a notch part which is provided in the top member so that the finger of the operator can access the lower guide member in the top member.

\* \* \* \* \*